US007645976B2

(12) United States Patent
Watanabe et al.

(10) Patent No.: US 7,645,976 B2
(45) Date of Patent: Jan. 12, 2010

(54) RADIATION DETECTING SYSTEM COMPRISING A PLURALITY OF SWITCHING ELEMENTS ORIENTATED IN THE SAME DIRECTION RELATIVE TO THE CONVERSION ELEMENT

(75) Inventors: Minoru Watanabe, Honjo (JP); Chiori Mochizuki, Sagamihara (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 5 days.

(21) Appl. No.: 11/916,919

(22) PCT Filed: Jul. 25, 2006

(86) PCT No.: PCT/JP2006/315087

§ 371 (c)(1),
(2), (4) Date: Dec. 7, 2007

(87) PCT Pub. No.: WO2007/013643

PCT Pub. Date: Feb. 1, 2007

(65) Prior Publication Data

US 2009/0032680 A1      Feb. 5, 2009

(30) Foreign Application Priority Data

Jul. 25, 2005    (JP)    ............................. 2005-214227
Jul. 18, 2006    (JP)    ............................. 2006-195146

(51) Int. Cl.
  *G01J 1/42*    (2006.01)
(52) U.S. Cl. ........................... 250/208.2; 250/214 DC; 250/214 SW
(58) Field of Classification Search .............. 250/208.1, 250/214 R, 214.1, 214 DC, 370.11, 370.09; 257/59, 72, 66
See application file for complete search history.

(56) References Cited

U.S. PATENT DOCUMENTS 6,020,590 A    2/2000    Aggas et al. ............ 250/370.09
7,205,547 B2   4/2007    Ishii et al. ............... 250/370.09

(Continued)

FOREIGN PATENT DOCUMENTS

CN    1474595 A2    2/2004

(Continued)

OTHER PUBLICATIONS

Int'l Search Report and Written Opinion of the International Searching Authority mailed Oct. 24, 2006, for International Application No. PCT/JP2006/315087.

*Primary Examiner*—Thanh X Luu
*Assistant Examiner*—Francis M Legasse, Jr.
(74) *Attorney, Agent, or Firm*—Fitzpatrick, Cella, Harper & Scinto

(57) ABSTRACT

A radiation detecting apparatus includes plural pixels each provided with a switching element disposed on an insulating substrate and a conversion element disposed on the switching element, and plural signal wirings arranged in one direction and connected with the plural switching elements, wherein the conversion elements have electrodes separated respectively for the pixels, the switching element is connected with the electrode for each pixel, and both ends of the signal wiring, opposed to each other in a width direction, and both ends of the control wiring, opposed to each other in a width direction are disposed inside of an area of the electrode when seen from above the conversion element.

12 Claims, 11 Drawing Sheets

U.S. PATENT DOCUMENTS

| | | | |
|---|---|---|---|
| 7,205,568 B2 | 4/2007 | Watanabe et al. | 257/59 |
| 2002/0145117 A1 | 10/2002 | Mochizuki | |
| 2003/0226974 A1* | 12/2003 | Nomura et al. | 250/370.11 |
| 2004/0101100 A1* | 5/2004 | Morii et al. | 378/98.7 |
| 2006/0062352 A1 | 3/2006 | Nomura et al. | 378/98.8 |
| 2006/0065944 A1 | 3/2006 | Mochizuki et al. | 257/444 |
| 2006/0071251 A1* | 4/2006 | Watanabe et al. | 257/291 |
| 2006/0249763 A1 | 11/2006 | Mochizuki et al. | 257/291 |
| 2007/0045556 A1 | 3/2007 | Watanabe et al. | 250/370.14 |
| 2007/0069107 A1 | 3/2007 | Ishii et al. | 250/208.1 |
| 2007/0272870 A1 | 11/2007 | Ishii et al. | 250/370.08 |

FOREIGN PATENT DOCUMENTS

| | | |
|---|---|---|
| CN | 1751393 A2 | 3/2006 |
| EP | 1246250 A2 | 10/2002 |
| EP | 1388740 A2 | 11/2004 |
| EP | 1593160 A1 | 11/2005 |
| JP | 2002-343952 A1 | 11/2002 |
| JP | 2004-15002 A | 1/2004 |
| JP | 2004-73256 A1 | 3/2004 |
| JP | 2004-265935 A1 | 9/2004 |
| JP | 2004-296654 A1 | 10/2004 |
| KR | 2005-103294 A1 | 10/2005 |
| WO | 2004/073069 A2 | 8/2004 |

* cited by examiner

RADIATION DETECTING SYSTEM COMPRISING A PLURALITY OF SWITCHING ELEMENTS ORIENTATED IN THE SAME DIRECTION RELATIVE TO THE CONVERSION ELEMENT

This Application is a National Stage filing under 35 U.S.C. § 371 of International Application No. PCT/JP2006/315087, filed Jul. 25, 2006.

TECHNICAL FIELD

The present invention relates to a radiation detecting apparatus for converting radiation into an electrical signal, and to a radiation detecting system utilizing such radiation detecting apparatus.

BACKGROUND ART

Recently, a radiation detecting apparatus, which incorporates, on an insulating substrate, pixels each formed by a TFT (thin film transistor) as a switching element and a conversion element for converting radiation such as X-rays into an electrical signal, is being commercially utilized. The conversion element includes, for example, the following two types. One is an indirect type conversion element, constituted of a photoelectric conversion element and a wavelength conversion member (such as a phosphor) for converting radiation such as X-rays into light in a wavelength region detectable by the photoelectric conversion element. Such indirect type conversion element executes a wavelength conversion of the radiation such as X-rays into light, by means of a wavelength conversion member such as a phosphor, disposed on a photoelectric conversion element, and executes a photoelectric conversion on the light from the wavelength conversion member by the photoelectric conversion element. The other is a direct type conversion element, which directly converts the radiation such as X-rays into an electrical signal, by means of a direct conversion semiconductor element including a semiconductor conversion material, capable of converting the X-rays or other radiation into the electrical signal, such as amorphous selenium (a-Se).

In such radiation detecting apparatus, a higher speed and a higher sensitivity are being required. For this purpose, it is required, while increasing the size of the switching element or providing plural switching elements for increasing the driving speed, to secure a large area of the conversion element, thereby detecting a larger amount of the radiation entering from above, or of the light converted from the radiation. The conversion element includes at least an upper electrode, a lower electrode and a semiconductor layer for converting the radiation into the electrical signal or a semiconductor layer for converting the light into the electrical signal, disposed between the upper and lower electrodes, and either one of the electrodes is two-dimensionally divided for pixel isolation, thereby realizing a two-dimensional array of pixels.

In a prior radiation detecting apparatus, U.S. Pat. No. 6,020,590 describes disposing a conversion element part, including a direct conversion semiconductor element, on a switching element part containing the switching element such as a TFT. As another example, in a radiation detecting apparatus disclosed in Japanese Patent Application Laid-open No. 2004-015002, a conversion element part (photoelectric conversion element) is disposed on the switching element part such as a TFT, and a phosphor is further disposed thereon (FIG. 20). The pixel electrode of the conversion element part is divided on the signal wiring, connected to the source electrode or the drain electrode of the TFT constituting the switching element part, and on the gate wiring.

DISCLOSURE OF THE INVENTION

An object of the present invention is to provide a radiation detecting apparatus, such as a radiation detecting apparatus, and a radiation detecting system, capable of realizing a higher definition in a captured image, and having a more easily manufacturable structure.

A radiation detecting apparatus of the present invention includes a plurality of pixels each provided with a switching element disposed on an insulating substrate and a conversion element disposed on the switching element, a plurality of signal wirings arranged along one direction and connected with the plural switching elements, and plural control wirings arranged along a direction different from the aforementioned one direction and connected with control terminals of the plural switching elements, wherein the conversion elements have electrodes separated respectively for the pixels, the switching element is connected with the electrode for each pixel, and both ends of the signal wiring, opposed to each other in a width direction, and both ends of the control wiring, opposed to each other in a width direction, are disposed within an area of the electrode as seen from above the conversion element.

"Arranged in one direction" or "arranged in a direction different from the aforementioned one direction" mentioned above means not only an arrangement in a linear array but also includes a case where a switching element is disposed on both sides on a wiring, as in a case of gate wiring shown in FIG. 18.

Also, the radiation detecting system of the present invention includes:

a radiation detecting apparatus of the present invention;

signal processing means which processes a signal from the radiation detecting apparatus;

recording means which records a signal from the signal processing means;

display means which displays a signal from the signal processing means;

transmission process means which transmits a signal from the signal processing means; and a radiation source for generating radiation.

In the present invention, the term "conversion element for converting radiation into an electrical signal" means an element capable of receiving radiation such as visible light, infrared light, X-rays, a particulate beam such as α-rays or β-rays, or γ-rays and converting it into an electrical signal, and includes a photoelectric conversion element for converting light such as visible light or infrared light into an electrical signal, and an element including for example amorphous selenium as a semiconductor layer and capable of converting radiation such as X-rays into an electrical signal.

In a radiation detecting apparatus including a plurality of pixels each having a conversion element for converting radiation into an electrical signal and a switching element, the present invention allows one to reduce and stabilize a variation in a capacitance between a wiring connected with the switching element and an electrode of the conversion element, thereby providing a radiation detecting apparatus of stabilized characteristics, and capable of providing a captured image or a displayed image for example with suppressed artifacts.

Also, the present invention allows one to dispense with a strict alignment between a wiring connected with the switching element and an electrode of the conversion element and also allows a manufacture in which an influence of a step difference caused by wirings is reduced, thereby facilitating the manufacturing process.

Other features and advantages of the present invention will be apparent from the following description taken in conjunc-

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

In the following, embodiments of the present invention will be explained in detail with reference to the accompanying drawings.

The radiation detecting apparatus of the present invention will be explained in detail by an example of a radiation detecting apparatus for converting radiation such as X-rays into an electrical signal. But it is not limited to such radiation detecting apparatus, but is applicable also to a detecting apparatus which converts light, such as visible light or infrared light, into an electrical signal.

First Embodiment

Figure 1:
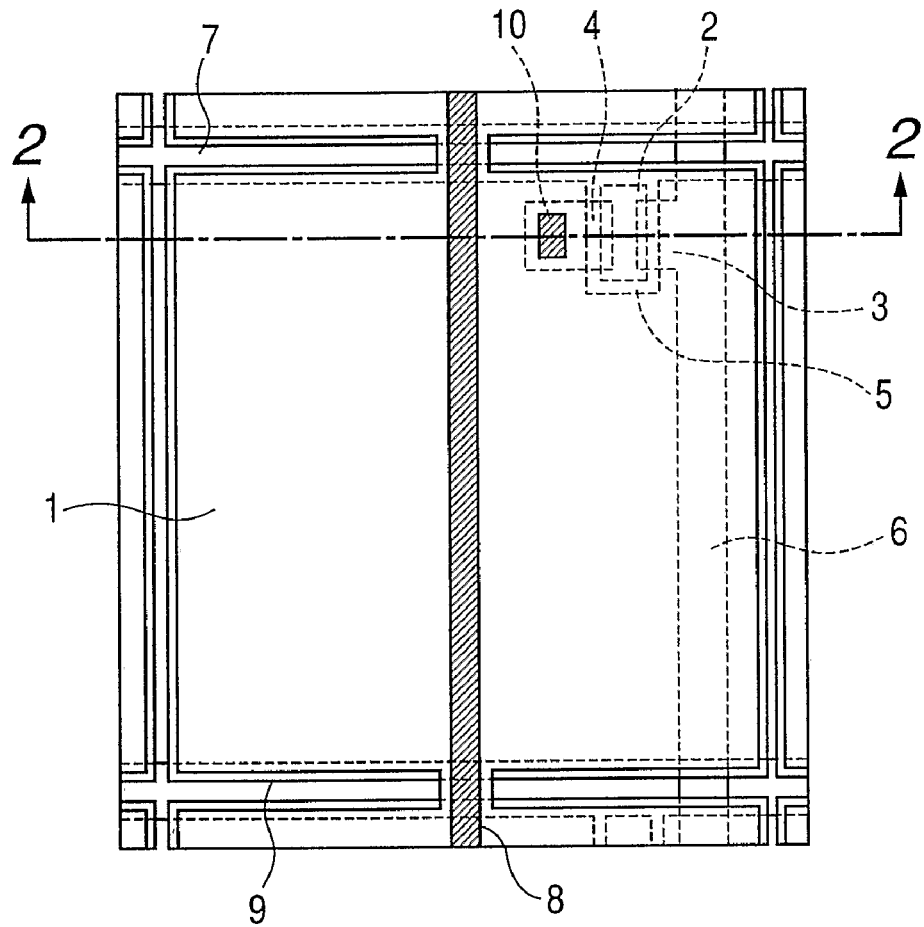
FIG. 1 is a plan view showing a structure of a pixel in a first embodiment of the present invention.
Figure 2:
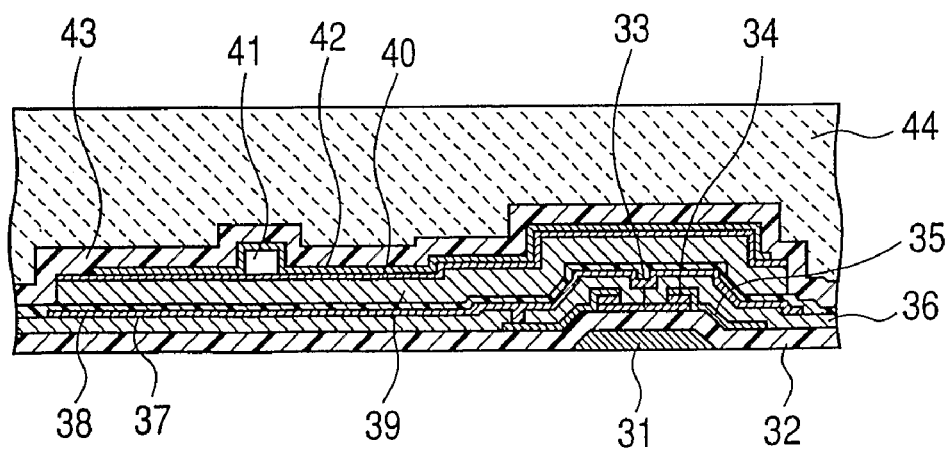
FIG. 2 is a cross-sectional view along a line 2-2 in FIG. 1.

In the following, a radiation detecting apparatus, constituting a first embodiment of the present invention, will be explained. The present embodiment has a structure in which a signal wiring or a gate wiring, constituting a control wiring, passes under a pixel electrode, isolated for each pixel, of a conversion element constituted of a photoelectric conversion element. FIGS. 1 and 2 illustrate a case in which the signal wiring is disposed under the pixel electrode.

FIG. 1 is a plan view showing a structure of a pixel in the radiation detecting apparatus of the first embodiment, illustrating a pixel including a switching element formed by a TFT and a conversion element and to be disposed in a two-dimensional matrix array. FIG. 2 is a cross-sectional view along a line 2-2 in FIG. 1.

Figure 10:
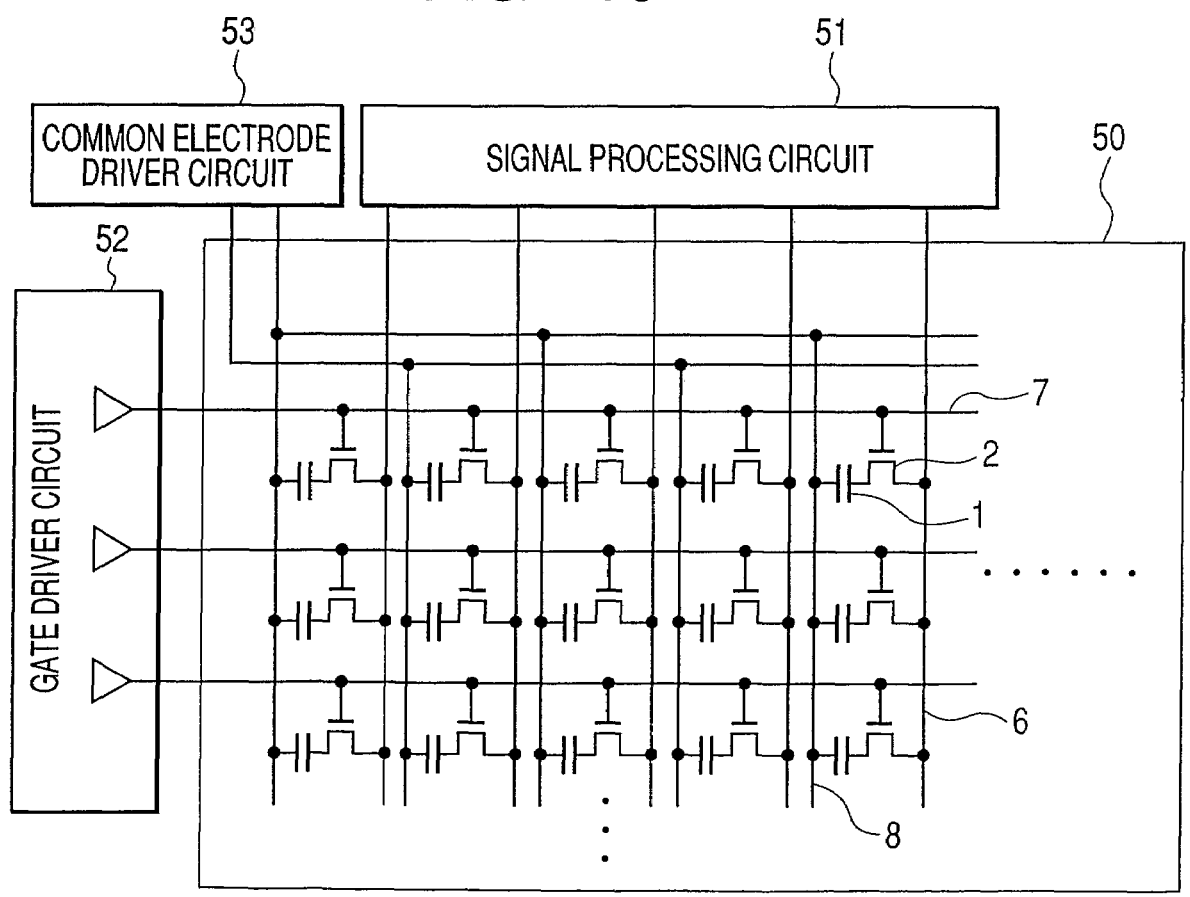
FIG. 10 is an equivalent circuit diagram showing a radiation detecting apparatus in which pixels of the embodiments shown in FIGS. 1 to 9 are arranged in a matrix pattern.
Figure 11:
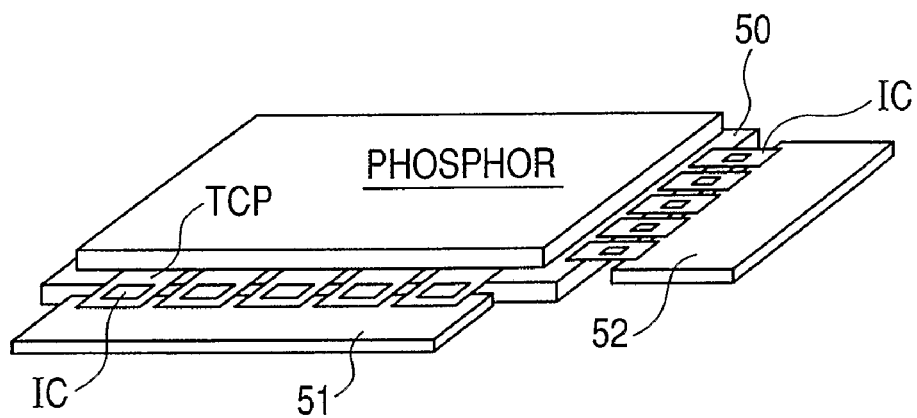
FIG. 11 is a perspective view showing a radiation detecting apparatus in which pixels of the embodiments shown in FIGS. 1 to 9 are arranged in a matrix pattern.

FIGS. 10 and 11 are respectively an equivalent circuit diagram and a perspective view of a radiation detecting apparatus, in which pixels like that shown in FIGS. 1 and 2 are arranged in a matrix array.

Referring to FIG. 1, a conversion element 1 is constituted of an MIS photoelectric conversion element of a metal-insulator-semiconductor structure for converting light, such as visible light or infrared light, into an electrical signal. And a phosphor (not shown in FIG. 1) is disposed thereon as a wavelength converting member for converting radiation such as X-rays, a particulate beam of α-rays or β-rays, or γ-rays into light, such as visible light, that can be photoelectrically converted in the MIS photoelectric conversion element. The phosphor may be constituted, for example, of CsI, which converts X-rays into a light.

A switching element 2, constituted of a TFT (thin film transistor) and functioning as a switching element, has three electrodes, including a source electrode 3 and a drain electrode 4 as two terminals, and a gate electrode 5 serving as a control terminal. A channel of the switching element 2 exists between the source electrode 3 and the drain electrode 4, and a charge flow in the channel can be controlled by a voltage control on the gate electrode 5.

The conversion element 1 has a layered structure from a pixel electrode 9 isolated for each pixel to a region under the bias wiring 8, and is disposed on the switching element 2. The pixel electrode 9 of the conversion element 1 is connected, via a through-hole 10, to the drain electrode 4 of the switching element 2.

Now reference is made to FIG. 2, showing a cross-sectional view along a line 2-2 in FIG. 1, for explaining the layered structure of a pixel in the first embodiment. The switching element 2 is disposed on a substrate, then the conversion element 1 is disposed thereon, and a phosphor layer 44 is disposed further thereon.

The switching element 2 includes a first electrode layer 31 constituting a gate electrode (corresponding to the gate electrode 5 in FIG. 1) and a gate wiring (corresponding to the gate wiring 7 in FIG. 1), a first insulation layer 32 constituting a gate insulation film, a first semiconductor layer 33, a first impurity-doped semiconductor layer 34 constituting an ohmic contact layer, and a second electrode layer 35 constituting source and drain electrodes (corresponding to the source electrode 3 and the drain electrode 4 in FIG. 1) and a signal wiring (corresponding the signal wiring 6 in FIG. 1).

The conversion element 1 is an MIS photoelectric converting element including a third electrode layer 37 isolated for each pixel (corresponding to the pixel electrode 9 in FIG. 1), a third insulation layer 38, a second semiconductor layer 39, a second impurity-doped semiconductor layer 40 functioning as an ohmic contact layer or a blocking layer, and a fifth electrode layer 42 (constituting an upper electrode), and is capable of a photoelectric conversion on a light such as a visible light. A fifth electrode layer 42 constituted of a transparent material such as ITO is disposed on the second impurity-doped semiconductor layer 40, but, in the case that the second impurity-doped semiconductor layer 40 has a low resistance, it may also serve as the electrode layer and the fifth electrode layer 42 may be dispensed with. In such case, the second impurity-doped semiconductor layer 40 serves as an upper electrode of the conversion element 1.

A fourth electrode layer 41 is a bias wiring (corresponding to a bias wiring 8 in FIG. 1) for a voltage application to the fifth electrode layer 42, and is connected to a common electrode driver circuit (common electrode driver circuit 53 in FIG. 10). The fourth electrode layer 41 is covered by the fifth electrode layer 42, but it is also possible to dispose the fifth electrode layer 42 under the fourth electrode layer 41. The third electrode layer 37 (corresponding to the pixel electrode 9 in FIG. 1) of the conversion element 1 is connected to one of the electrodes (drain electrode) formed by the second electrode layer 35 constituting the switching element 2, via a through hole (corresponding to the through hole 10 in FIG. 1) formed in the second insulation layer 36 constituting the interlayer insulation layer. By turning on the switching element 2, a charge corresponding to the carriers generated in the second semiconductor layer 39 of the conversion element 1 can be transferred to an external signal processing circuit (signal processing circuit 51 shown in FIG. 10).

In the present embodiment, as will be understood from the structures shown in FIGS. 1 and 2, in an area between a normal projection area of the pixel electrode 9 on the substrate and the pixel electrode 9, the signal wiring 6 is so disposed as to pass through such area in such a manner that both ends thereof opposite to each other in a width direction are present in such area (passing through under the pixel electrode 9 of the conversion element 1 without jutting out). In such structure, even if the positional relationship of the signal wiring 6 and the pixel electrode 9 of the conversion element 1 is displaced by an alignment error in the exposure apparatus employed in the manufacturing process, the overlapping area of the signal wiring 6 and the pixel electrode 9 of the conversion element 1 remains the same, to maintain a constant capacitance between the signal wiring 6 and the pixel electrode 9 of the conversion element 1. By this means image artifacts, resulting from a fluctuation in the capacitance in the pixel, can be suppressed in the image obtained by the radiation detecting apparatus.

A similar effect can be obtained by disposing the gate wiring 7, in an area between a normal projection area of the pixel electrode 9 on the substrate and the pixel electrode 9, so as to pass through such area in such a manner that both ends opposite to each other in a width direction are present in such area (so as to be inside the electrode area when seen from above the conversion element, or so as that the gate electrode 7 passes through under the pixel electrode 9 of the conversion element 1 without jutting out). It is therefore also possible to dispose the gate wiring 7 alone so as to pass through inside such area. However, it is considered more important to dispose the signal wiring 6 so as to pass through under the pixel electrode 9 without jutting out, since the signal wiring 6 handles a small charge converted in each pixel and a variation in the capacitance of the signal wiring is directly reflected as an image artifact.

Also, a similar effect can be obtained by disposing the switching element 2 within an area between a normal projection area of the pixel electrode 9 on the substrate and the pixel electrode 9. In the case that a part of the source electrode 3 or the drain electrode 4 of the switching element 2 protrudes out from under the pixel electrode 9 and is disposed in an adjacent pixel area, a variation of the capacitance among the pixels is caused by a displaced positional relationship, induced by an alignment error in the exposure apparatus employed in the manufacturing process. The above-described constitution provides similar effects in all the embodiments of the radiation detecting apparatus of the present invention.

Figure 21:
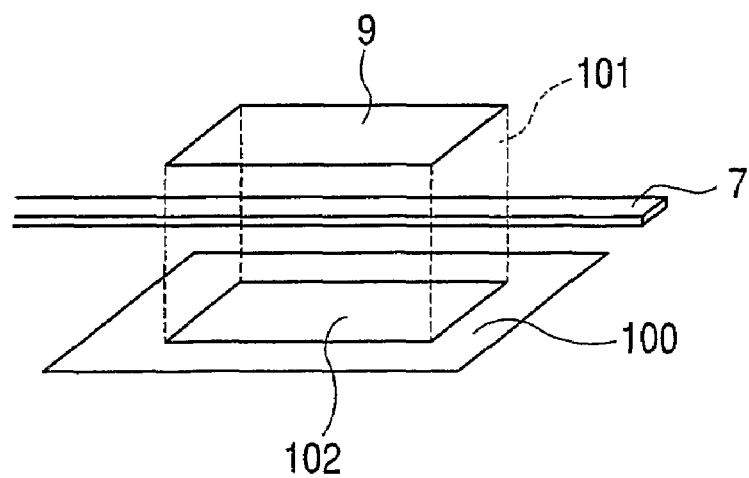
FIG. 21 is a schematic view showing a state in which a signal wiring or a gate wiring passes through an area between a normal projection area of the lower electrode 9 onto a substrate and the lower electrode 9.

FIG. 21 schematically shows a state in which a signal wiring 6 or a gate wiring 7 passes through an area 101 between a normal projection area 102 of the pixel electrode 9 onto the substrate 100 and the pixel electrode 9.

As will be seen from the layered structure shown in FIG. 2, the third electrode layer 37 (pixel electrode of the conversion element 1) is so disposed as to cover the second electrode layer 35 constituting the signal wiring 6. Such arrangement provides a structure that, in the area between the normal projection area of the pixel electrode 9 on the substrate and the pixel electrode 9, the signal wiring 6 is so disposed as to pass through such area in such a manner that both ends thereof opposite to each other in a width direction are present in such area. Therefore, even in the case of an alignment error in the exposure apparatus employed in the manufacturing process, the overlapping area remains constant, to suppress a capacitance variation in the pixel electrode 9. Also the fifth electrode layer 42 (upper electrode of the conversion element 1) is preferably so disposed as to cover the second electrode layer 35, constituting the signal wiring 6. And in the present embodiment, both the third electrode layer 37 (pixel electrode of the conversion element 1) and the fifth electrode layer 42 (upper electrode of the conversion element 1) are so disposed as to cover the second electrode layer 35 constituting the signal wiring 6. In the case that the third electrode layer 37 (pixel electrode of the conversion element 1) is so constructed as to cover the gate wiring 7, it is naturally preferable that the fifth electrode layer 42 (upper electrode of the conversion element 1) is also so disposed as to cover the gate wiring 7. Also, in the case that the third electrode layer 37 (pixel electrode of the conversion element 1) is so constructed as to cover the switching element 2, it is naturally preferable that the fifth electrode layer 42 (upper electrode of the conversion element 1) is also so disposed as to cover the switching element 2.

Now reference is made to FIGS. 10 and 11, for explaining a constitution of a radiation detecting apparatus, formed by disposing the pixels, explained in FIGS. 1 and 2, in a matrix array.

As shown in FIG. 10, pixels each having a conversion element 1 and a switching element 2 are arrayed in a two-dimensional matrix on a substrate. And gate wirings 7 connected to the gate electrodes 5 of the switching elements 2 and signal wirings 6 connected to the source electrodes 3 of the switching elements 2 are provided respectively in a number corresponding to the number of rows of the pixels and in a number corresponding to the number of columns of the pixels. In a peripheral portion of the substrate, a signal processing circuit 51, a common electrode driver circuit 52 and a gate driver circuit 52 are disposed. A gate wiring 7, connected with the gate electrode 5 of the switching element 2, is connected with the gate driver circuit 52 for on/off controlling the switching element 2, and a signal wiring 6, connected with the source electrode 3 of the switching element 2, is connected with the signal processing circuit 41 for reading and processing an accumulated charge. Also, a bias wiring 8, connected with an electrode (upper electrode) of the conversion element 1, is connected with the common electrode driver circuit 53.

As shown in FIG. 11, the gate driver circuit 52 and the signal processing circuit 51 are disposed in a peripheral portion of a panel, and a phosphor is disposed thereon, for converting a radiation into a light such as a visible light. FIG. 10 shows the signal processing circuit 51 and the common electrode driver circuit 53 separately, but in fact the common electrode driver circuit 53 is incorporated in the signal processing circuit 51 as shown in FIG. 11. The gate driver circuit 52 and the signal processing circuit 51 are connected to the substrate 50 through a TCP (tape carrier package: a film carrying an IC) carrying an IC. FIG. 11 shows a system of converting radiation by means of a phosphor into light such as visible light and then executing a photoelectric conversion by means of the photoelectric conversion element, but it is also possible to utilize a semiconductor element for converting radiation such as X-rays, a particulate beam of α-rays or β-rays, or γ-rays directly into an electrical signal as the conversion element 1, thereby dispensing with the phosphor. The semiconductor element capable of direct conversion of X-rays may include a semiconductor material such as amorphous selenium (a-Se). Also, there has been explained a structure employing a photoelectric conversion element for converting light such as visible light into an electrical signal and depositing a phosphor such as CsI directly thereon. But it is also possible to form a phosphor on a substrate of a radiation-transmitting material such as carbon and to adhere the surface of such phosphor with an adhesive material to a substrate bearing pixels each having the conversion element 1 and the switching element 2.

Second Embodiment

The present embodiment shows a case in which a signal wiring and a gate wiring pass through under a pixel electrode.

Figure 3:
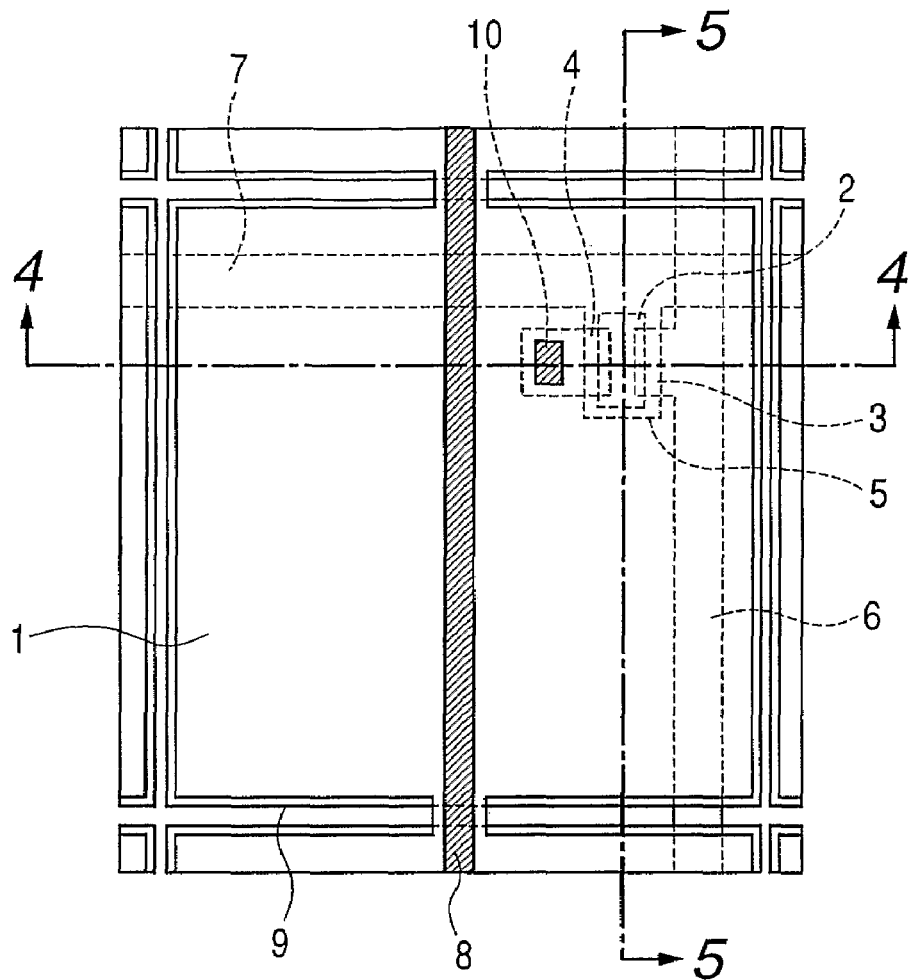
FIG. 3 is a plan view showing a structure of a pixel in a second embodiment of the present invention.
Figure 4:
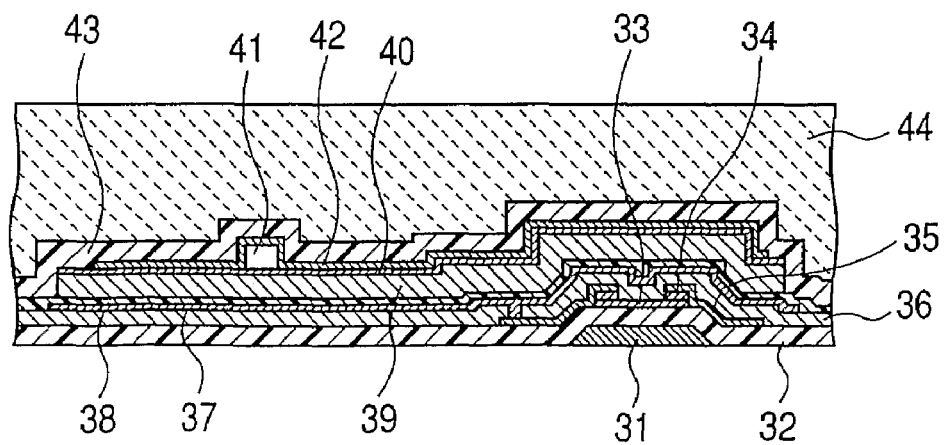
FIG. 4 is a cross-sectional view along a line 4-4 in FIG. 3.
Figure 5:
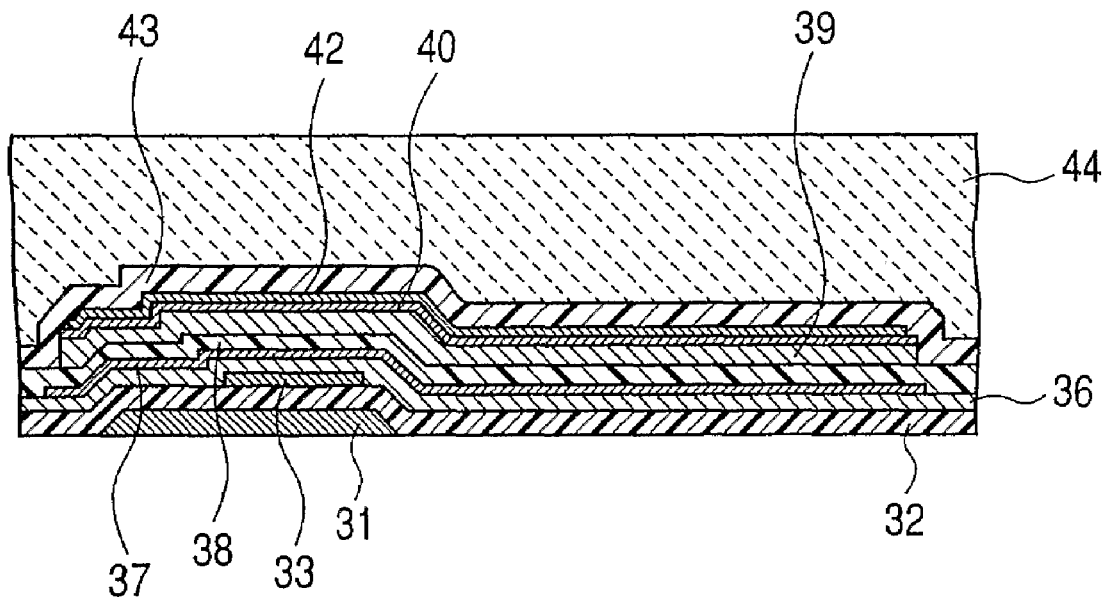
FIG. 5 is a cross-sectional view along a line 5-5 in FIG. 3.

FIG. 3 is a plan view showing a structure of a pixel in the second embodiment of the present invention, FIG. 4 is a cross-sectional view along a line 4-4 in FIG. 3, and FIG. 5 is a cross-sectional view along a line 5-5 in FIG. 3. In FIGS. 4 and 5, components the same as or equivalent to those in FIG. 2 are represented by like characters and not explained further. Also, the constitution of the radiation detecting apparatus formed by a two-dimensional matrix array of pixels is the same as that in FIGS. 10 and 11.

A conversion element 1 is constituted, as in the embodiment 1, of an MIS photoelectric conversion element. On the MIS photoelectric conversion element, a phosphor such as CsI is disposed as a wavelength converting member for converting radiation such as X-rays, a particulate beam of α-rays or β-rays, or γ-rays into light, such as visible light, that can be photoelectrically converted in the MIS photoelectric conversion element.

In the structure of the embodiment 1 shown in FIG. 1, the signal wiring 6 is so disposed, in the area between the normal projection area of the pixel electrode 9 on the substrate and the pixel electrode 9, as to pass through such area in such a manner that both ends opposite to each other in a width direction are present in such area (so as to be inside the electrode area without jutting out). In the present embodiment shown in FIG. 3, not only the signal wiring 6 but also the gate wiring 7 are so disposed as to pass through the aforementioned area in such a manner that both ends opposite to each other in a width direction are present in such area.

As will be seen from FIG. 4, the third electrode layer 37 (pixel electrode of the conversion element 1) is so disposed as to cover the second electrode layer 35 constituting the signal wiring 6. Such arrangement provides a structure that, in the area between the normal projection area of the pixel electrode 9 on the substrate and the pixel electrode 9, the signal wiring 6 is so disposed as to pass through such area in such a manner that both ends thereof opposite to each other in a width direction are present in such area. Therefore, even in the case of an alignment error in the exposure apparatus employed in the manufacturing process, the overlapping area remains constant, to suppress a capacitance variation in the pixel electrode 9. Also the fifth electrode layer 42 (upper electrode of the conversion element 1) is preferably so disposed as to cover the second electrode layer 35, constituting the signal wiring 6.

And in the present embodiment, both the third electrode layer 37 (pixel electrode of the conversion element 1) and the fifth electrode layer 42 (upper electrode of the conversion element 1) are so disposed as to cover the second electrode layer 35 constituting the signal wiring 6.

Also, as will be seen from FIG. 5, the third electrode layer 37 (pixel electrode of the conversion element 1) is so disposed as to cover the first electrode layer 31 constituting the gate wiring 7. Such arrangement provides a structure in which, in the area between the normal projection area of the pixel electrode 9 on the substrate and the pixel electrode 9, the gate wiring 7 is so disposed as to pass through such area in such a manner that both ends of the gate wiring 7 opposite to each other in a width direction are present in such area. Therefore, even in the case of an alignment error in the exposure apparatus employed in the manufacturing process, the overlapping area remains constant, to suppress a capacitance variation in the pixel electrode 9. Also, the fifth electrode layer 42 (upper electrode of the conversion element 1) is preferably so disposed as to cover the first electrode layer 31, constituting the gate wiring 7. And in the present embodiment, both the third electrode layer 37 (pixel electrode of the conversion element 1) and the fifth electrode layer 42 (upper electrode of the conversion element 1) are so disposed as to cover the first electrode layer 31 constituting the gate wiring 7.

In such structure, even if the positional relationship of the signal wiring 6 and the pixel electrode 9 of the conversion element 1 is displaced by an alignment error in the exposure apparatus employed in the manufacturing process, the overlapping area of the signal wiring 6 and the pixel electrode 9 of the conversion element 1 remains the same, to maintain a constant capacitance between the signal wiring 6 and the pixel electrode 9 of the conversion element 1, whereby image artifacts, resulting from a fluctuation in the capacitance in the pixel, can be suppressed in the image obtained by the radiation detecting apparatus. Also, as regards the gate wiring 7, the overlapping area of the gate wiring 7 and the pixel electrode 9 of the conversion element 1 remains constant, even in the case of a displacement in the positional relationship by an alignment error, thereby stabilizing the capacitance of the gate wiring 7. Therefore a transfer ability is stabilized among the pixels, and image artifacts, resulting from a fluctuation in the transfer ability among the pixels, can be suppressed.

Also, as in the first embodiment, by disposing the switching element 2 in the area between the normal projection area of the pixel electrode 9 on the substrate and the pixel electrode 9, the overlapping area between the pixel electrode 9 of the conversion element 1 and the switching element 2 remains constant thereby stabilizing the capacitance.

FIGS. 3 to 5 show a system of employing a photoelectric conversion element for converting light such as visible light into an electrical signal and depositing a phosphor directly thereon. But it is also possible to form a phosphor on a substrate of a radiation-transmitting material such as carbon and to adhere the surface of such phosphor with an adhesive material to a substrate bearing photoelectric conversion elements. It is also possible to utilize a semiconductor element for converting radiation such as X-rays, a particulate beam of α-rays or β-rays, or γ-rays directly into an electrical signal as the conversion element 1, thereby dispensing with the phosphor. The semiconductor element capable of direct conversion of X-rays may include a semiconductor material such as amorphous selenium (a-Se).

Third Embodiment

The present embodiment shows a case in which an organic insulation layer is provided as a planarization film between the switching element 2 and the conversion element 1.

Figure 6:
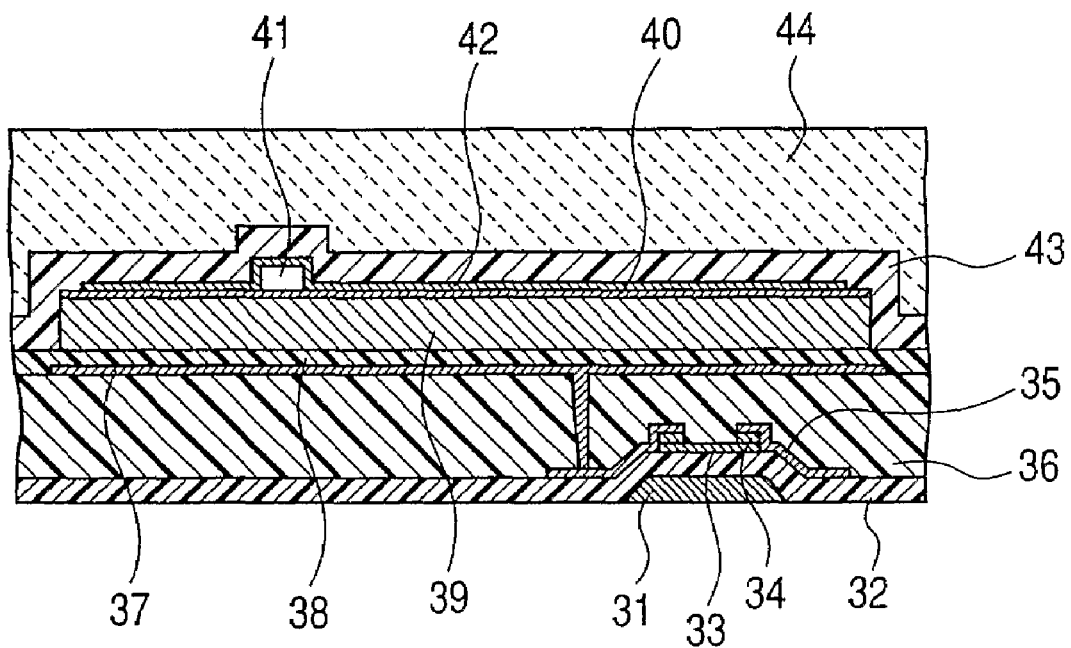
FIG. 6 is a cross-sectional view showing a structure of a pixel in a third embodiment of the present invention, corresponding to a cross-section along a line 4-4 in FIG. 3.
Figure 7:
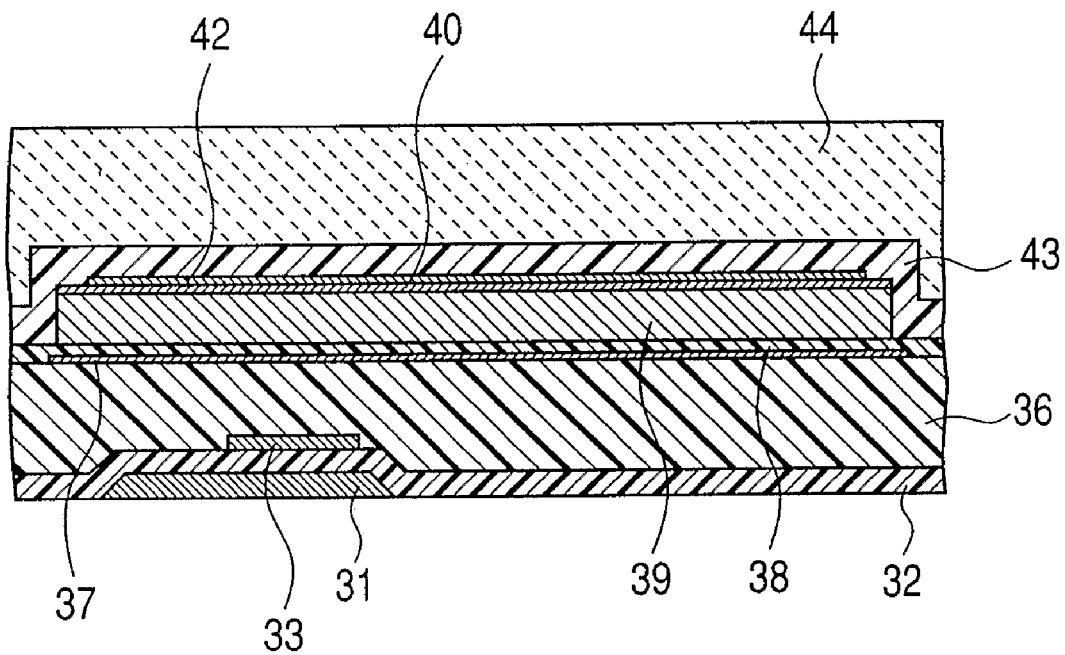
FIG. 7 is a cross-sectional view showing a structure of a pixel in a third embodiment of the present invention, corresponding to a cross-section along a line 5-5 in FIG. 3.

FIGS. 6 and 7 are cross-sectional views showing a structure of a pixel in a radiation detecting apparatus in the third embodiment of the present invention.

The pixel in a plan view has a structure same as that shown in FIG. 3. FIG. 6 is a cross-sectional view along a line 4-4 in FIG. 3, and FIG. 7 is a cross-sectional view along a line 5-5 in FIG. 3. The constitution of the radiation detecting apparatus formed by a two-dimensional matrix array of pixels is the same as that in FIGS. 10 and 11. As a conversion element, an MIS photoelectric conversion element including a structure of metal film-insulation layer-semiconductor layer is utilized as in the first and second embodiments.

In the following, the constitution will be explained with reference to the cross-sectional views shown in FIGS. 6 and 7. In FIGS. 6 and 7, components the same as or equivalent to those in FIGS. 4 and 5 are represented by like characters and not explained further.

The structure shown in FIGS. 6 and 7 is different, from that shown in FIGS. 4 and 5, in the use, as the second insulation layer 36 between the switching element 2 and the conversion element 1, of an organic interlayer insulation film, which has a function as a planarization layer. It is thus rendered possible to reduce a capacitance, formed between the switching element 2 and the conversion element 1. An increase in a total capacity of the signal wiring and the gate wiring leads to an increased noise in the image captured by the radiation detecting apparatus, or requires a larger time constant in a transfer operation of the TFT, whereby the image cannot be read at a high speed. It is therefore desirable to dispose, between the switching element 2 and the conversion element 1, an organic insulation layer that has a low dielectric constant and that can be formed in a thick film.

The organic insulation layer is preferably formed with a material having a high heat resistance and a low dielectric constant, such as an acrylic resin or a polyimide, and is preferably formed with a thickness of 1 μm or larger in a thinnest part. The organic insulation layer may be formed, for example by BCB (benzocyclobutene) produced by Dow Chemical Inc. The interlayer insulation layer need not be constituted of an organic insulation layer but may have a multi-layered structure constituted of an organic insulation layer and an inorganic insulation layer employed in FIG. 4.

As will be seen from FIG. 6, the third electrode layer 37 (pixel electrode of the conversion element 1) is so disposed as to cover the second electrode layer 35 constituting the signal wiring 6. Such arrangement provides a structure that, in the area between the normal projection area of the pixel electrode 9 on the substrate and the pixel electrode 9, the signal wiring 6 is so disposed as to pass through such area in such a manner that both ends thereof opposite to each other in a width direction are present in such area. Therefore, even in the case of an alignment error in the exposure apparatus employed in the manufacturing process, the overlapping area remains constant, to suppress a capacitance variation in the pixel electrode 9. Also, the fifth electrode layer 42 (upper electrode of the conversion element 1) is preferably so disposed as to cover the second electrode layer 35, constituting the signal wiring 6. And in the present embodiment, both the third electrode layer 37 (pixel electrode of the conversion element 1) and the fifth electrode layer 42 (upper electrode of the conversion element 1) are so disposed as to cover the second electrode layer 35 constituting the signal wiring 6.

Also, as will be seen from FIG. 7, the third electrode layer 37 (pixel electrode of the conversion element 1) is so disposed as to cover the first electrode layer 31 constituting the gate wiring 7. Such arrangement provides a structure in which, in the area between the normal projection area of the pixel electrode 9 on the substrate and the pixel electrode 9, the gate wiring 7 is so disposed as to pass through such area in such a manner that both ends of the gate wiring 7 opposite to each other in a width direction are present in such area. Therefore, even in the case of an alignment error in the exposure apparatus employed in the manufacturing process, the overlapping area remains constant, to suppress a capacitance variation in the pixel electrode 9. Also, the fifth electrode layer 42 (upper electrode of the conversion element 1) is preferably so disposed as to cover the first electrode layer 31, constituting the gate wiring 7. And in the present embodiment, both the third electrode layer 37 (pixel electrode of the conversion element 1) and the fifth electrode layer 42 (upper electrode of the conversion element 1) are so disposed as to cover the first electrode layer 31 constituting the gate wiring 7.

Also, as in the first embodiment, by disposing the switching element 2 in the area between the normal projection area of the pixel electrode 9 on the substrate and the pixel electrode 9, the overlapping area between the pixel electrode 9 of the conversion element 1 and the switching element 2 remains constant, thereby stabilizing the capacitance.

FIGS. 6 and 7 show a system of employing a photoelectric conversion element for converting light such as visible light into an electrical signal and depositing a phosphor directly thereon, but it is also possible to form a phosphor on a substrate of a radiation-transmitting material such as carbon and to adhere the surface of such phosphor with an adhesive material to a substrate bearing photoelectric conversion elements. It is also possible to utilize a semiconductor element for converting radiation such as X-rays, a particulate beam of α-rays or β-rays, or γ-rays directly into an electrical signal as the conversion element 1, thereby dispensing with the phosphor. The semiconductor element capable of direct conversion of X-rays may include a semiconductor material such as amorphous selenium (a-Se).

The structure of the present embodiment is applicable, as in the first embodiment, also to a case where the signal wiring 6 alone is disposed so as to pass through the area between the normal projection area of the pixel electrode 9 on the substrate and the pixel electrode 9. It is also applicable to a case where the gate wiring 7 alone is disposed so as to pass through the area between the normal projection area of the pixel electrode 9 on the substrate and the pixel electrode 9.

Fourth Embodiment

The present embodiment shows a structure of disposing a PIN photoelectric conversion element, constituted of an n-impurity-doped semiconductor layer, a semiconductor layer and a p-impurity-doped semiconductor layer as the conversion element 1, on the signal wiring 6 and the switching element 2, and utilizing an organic insulation layer between the switching element 2 and the conversion element 1.

Figure 8:
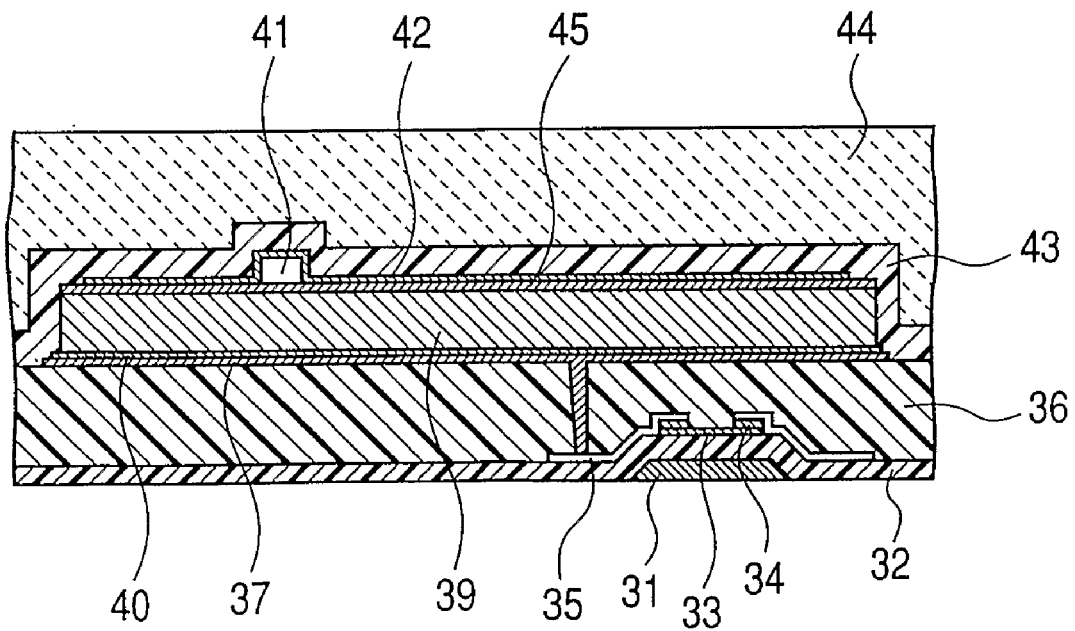
FIG. 8 is a cross-sectional view showing a structure of a pixel in a fourth embodiment of the present invention, corresponding to a cross-section along a line 4-4 in FIG. 3.
Figure 9:
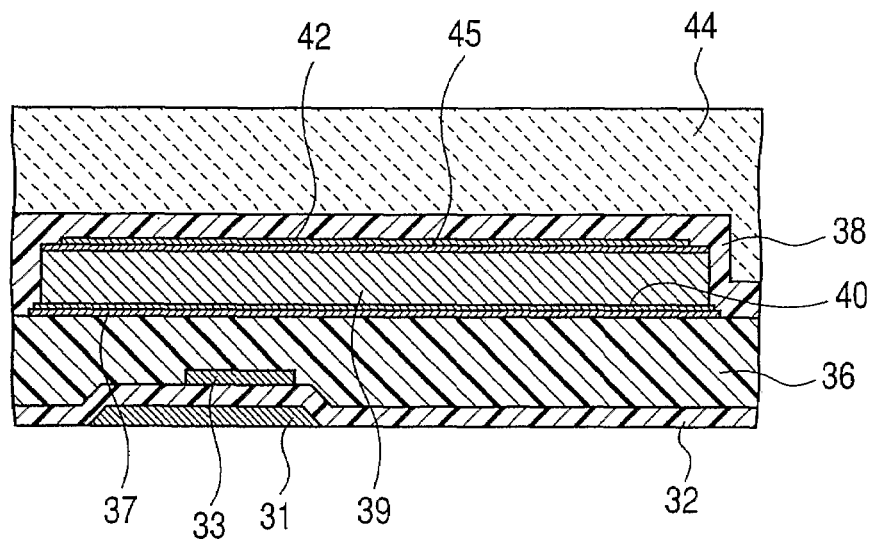
FIG. 9 is a cross-sectional view showing a structure of a pixel in a third embodiment of the present invention, corresponding to a cross-section along a line 5-5 in FIG. 3.

FIGS. 8 and 9 are cross-sectional views showing a structure of a pixel in a radiation detecting apparatus in the fourth embodiment of the present invention. The pixel in a plan view has a structure same as that shown in FIG. 3. FIG. 8 is a cross-sectional view along a line 4-4 in FIG. 3, and FIG. 9 is a cross-sectional view along a line 5-5 in FIG. 3. In FIGS. 8 and 9, components the same as or equivalent to those in FIGS. 4 and 5 are represented by like characters and not explained further.

The constitution of the radiation detecting apparatus formed by a two-dimensional matrix array of pixels is same as that in FIGS. 10 and 11.

In the following, the constitution will be explained with reference to the cross-sectional views shown in FIGS. 8 and 9.

The structure shown in FIGS. 8 and 9 is different from those shown in FIGS. 4 to 7, in using an organic insulation layer as the second insulation layer 36 to be formed as the interlayer insulation layer between the switching element 2 and the conversion element 1, and disposing, as the conversion element 1, a PIN photoelectric conversion element constituted of a second n-impurity-doped semiconductor layer 40, a second semiconductor layer 39 and a third p-impurity-doped semiconductor layer 45. As will be seen from FIG. 8, the third electrode layer 37 (pixel electrode of the conversion element 1) is so disposed as to cover the second electrode layer 35 constituting the signal wiring 6. Such arrangement provides a structure in which, in the area between the normal projection area of the pixel electrode 9 on the substrate and the pixel electrode 9, the signal wiring 6 is so disposed as to pass through such area in such a manner that both ends thereof opposite to each other in a width direction are present in such area. Therefore, even in the case of an alignment error in the exposure apparatus employed in the manufacturing process, the overlapping area remains constant, to suppress a capacitance variation in the pixel electrode 9. Also, the fifth electrode layer 42 (upper electrode of the conversion element 1) is preferably so disposed as to cover the second electrode layer 35, constituting the signal wiring 6. And in the present embodiment, both the third electrode layer 37 (pixel electrode of the conversion element 1) and the fifth electrode layer 42 (upper electrode of the conversion element 1) are so disposed as to cover the second electrode layer 35 constituting the signal wiring 6.

Also, as will be seen from FIG. 9, the third electrode layer 37 (pixel electrode of the conversion element 1) is so disposed as to cover the first electrode layer 31 constituting the gate wiring 7. Such arrangement provides a structure that, in the area between the normal projection area of the pixel electrode 9 on the substrate and the pixel electrode 9, the gate wiring 7 is so disposed as to pass through such area in such a manner that both ends of the gate wiring 7 opposite to each other in a width direction are present in such area. Therefore, even in the case of an alignment error in the exposure apparatus employed in the manufacturing process, the overlapping area remains constant, to suppress a capacitance variation in the pixel electrode 9. Also, the fifth electrode layer 42 (upper electrode of the conversion element 1) is preferably so disposed as to cover the first electrode layer 31, constituting the gate wiring 7, and, in the present embodiment, both the third electrode layer 37 (pixel electrode of the conversion element 1) and the fifth electrode layer 42 (upper electrode of the conversion element 1) are so disposed as to cover the first electrode layer 31 constituting the gate wiring 7.

Also, as in the first embodiment, by disposing the switching element 2 in the area between the normal projection area of the pixel electrode 9 on the substrate and the pixel electrode 9, the overlapping area between the pixel electrode 9 of the conversion element 1 and the switching element 2 remains constant, thereby stabilizing the capacitance.

FIGS. 8 and 9 show a system of employing a photoelectric conversion element for converting light such as visible light into an electrical signal and depositing a phosphor directly thereon. But it is also possible to form a phosphor on a substrate of a radiation-transmitting material such as carbon and to adhere the surface of such phosphor with an adhesive material to a substrate bearing photoelectric conversion elements. It is also possible to utilize a semiconductor element for converting radiation such as X-rays, a particulate beam of α-rays or β-rays, or γ-rays directly into an electrical signal as the conversion element 1, thereby dispensing with the phosphor. The semiconductor element capable of direct conversion of X-rays may include a semiconductor material such as amorphous selenium (a-Se).

The structure of the present embodiment is applicable, as in the first embodiment, also to a case where the signal wiring 6 alone is so disposed to pass through under the pixel electrode 9 of the conversion element without protruding therefrom, and also to a case where the gate wiring 7 alone is so disposed to pass through under the pixel electrode 9 of the conversion element without protruding therefrom.

The foregoing embodiments have shown structures where both the pixel electrode 9 of the conversion element 1 and the fifth electrode layer 42 (upper electrode) are so disposed as to cover the switching element 2 and the signal wiring 6 or the gate wiring 7. But there may be adopted a structure in which the pixel electrode 9 of the conversion element 1 covers the switching element 2 and the signal wiring 6 or the gate wiring 7. The second semiconductor layer 39 or the fifth electrode layer 42, disposed on the pixel electrode need not be isolated in each pixel but may be mutually connected among the pixels.

Fifth Embodiment

FIGS. 12 to 16 are respectively a plan view, cross-sectional views, an equivalent circuit diagram and a perspective view of a pixel in a fifth embodiment of the present invention.

Figure 12:
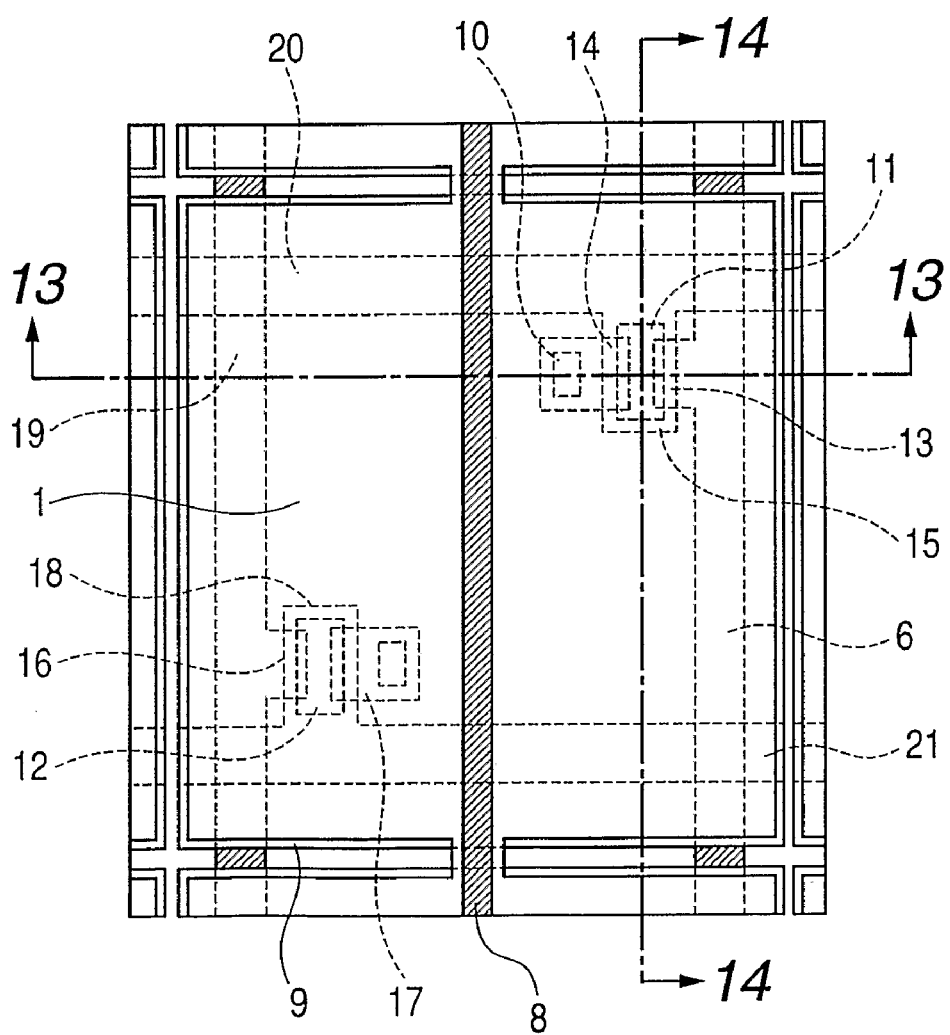
FIG. 12 is a plan view showing a structure of a pixel in a fifth embodiment of the present invention.
Figure 13:
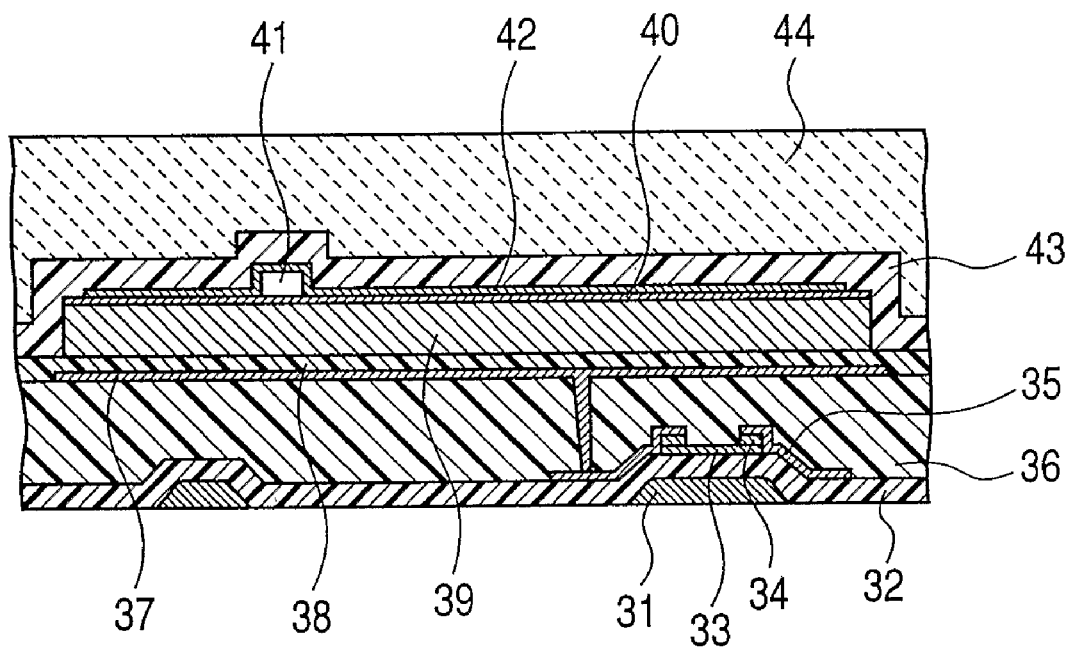
FIG. 13 is a cross-sectional view along a line 13-13 in FIG. 12.
Figure 14:
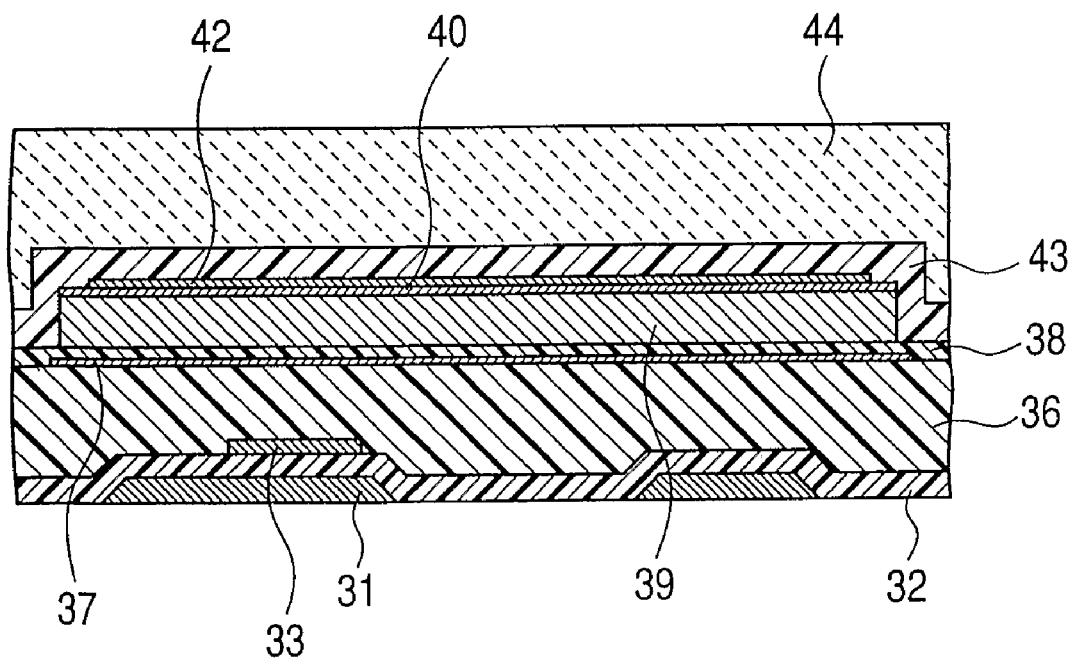
FIG. 14 is a cross-sectional view along a line 14-14 in FIG. 12.

FIG. 12 is a plan view of a pixel in a radiation detecting apparatus of the fifth embodiment of the present invention, illustrating a pixel, constituted of two switching elements and a conversion element, in a matrix array. FIG. 13 is a cross-sectional view along a line 13-13 in FIG. 12, and FIG. 14 is a cross-sectional view along a line 14-14 in FIG. 12. A conversion element 1 is constituted of an MIS photoelectric conversion element, and an organic insulation layer is employed as an interlayer insulation layer between the switching elements 2 and the photoelectric conversion element. The present embodiment is however naturally applicable to a structure not utilizing the organic insulation layer as shown in FIGS. 3 to 5.

Figure 15:
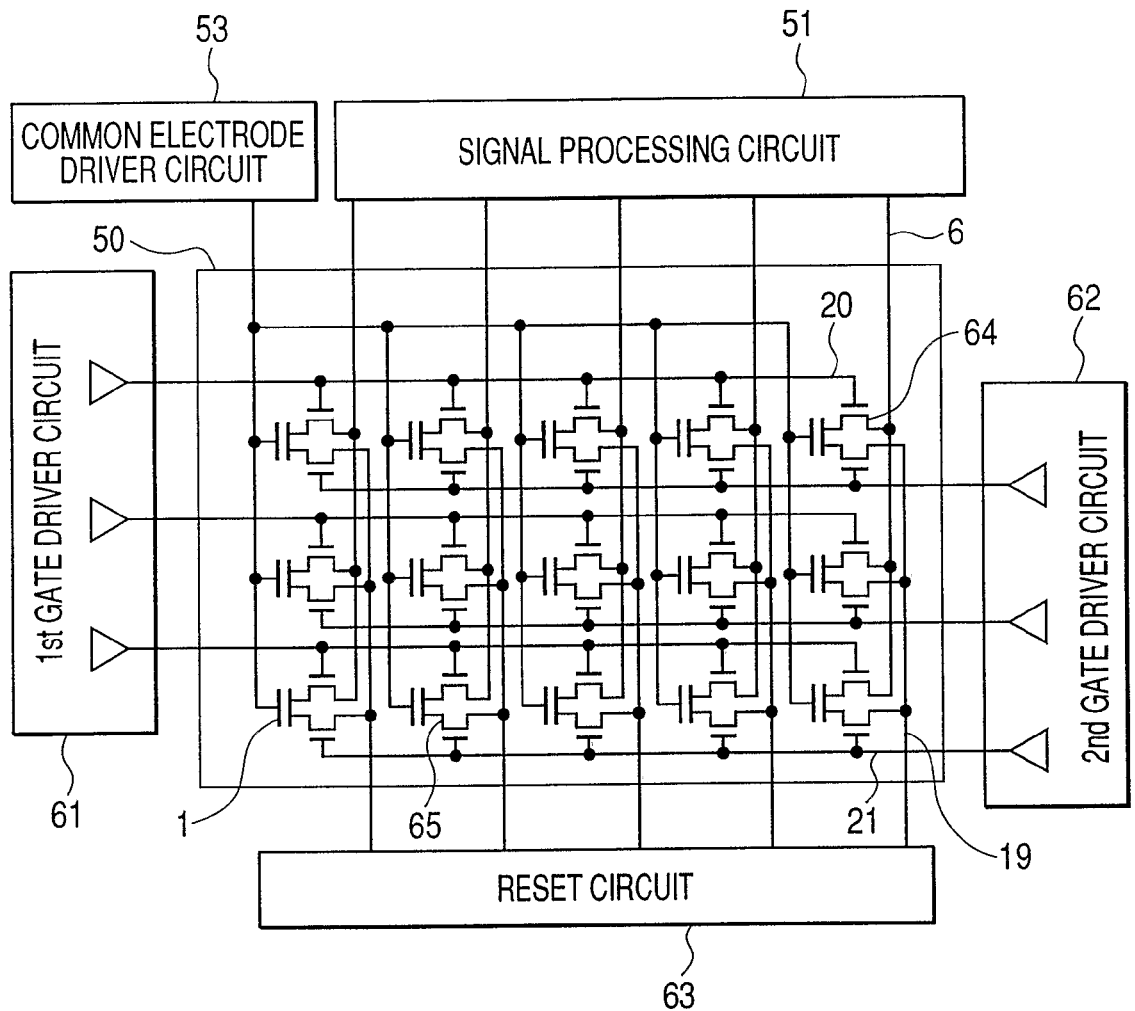
FIG. 15 is an equivalent circuit diagram of the pixel shown in FIG. 12.

FIG. 15 is an equivalent circuit diagram of the radiation detecting apparatus shown in FIG. 12, including a matrix array of 3 rows by 5 columns of the pixels each having two switching elements and a conversion element, and, in a peripheral part, a signal processing circuit 51, a resetting circuit 63, first and second gate driver circuits 61, 62 and a common electrode driver circuit 53.

Figure 16:
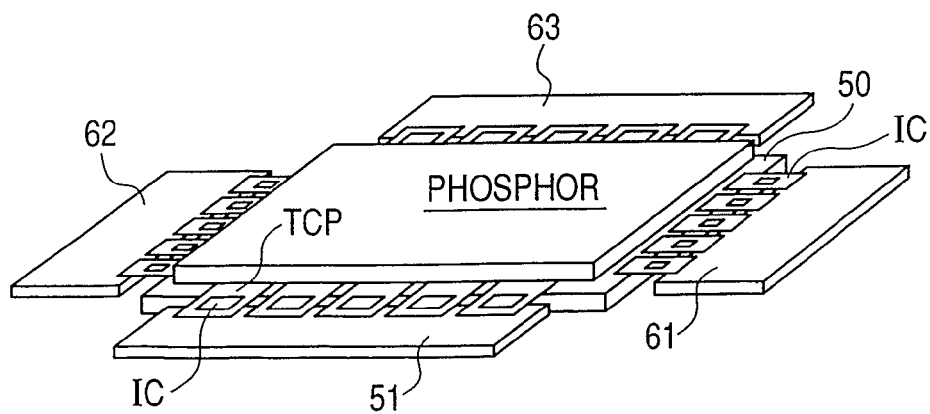
FIG. 16 is a view showing a schematic structure of a radiation detecting apparatus in the fifth embodiment of the present invention.

FIG. 16 is a view showing a schematic structure of the radiation detecting apparatus of the present embodiment, showing an example having two or more driver circuits and a signal processing circuit in the peripheral part and a phosphor, for converting the radiation into a light such as a visible light, on the panel.

The conversion element 1 in the present embodiment is also constituted of an MIS photoelectric conversion element for converting light such as visible light or infrared light into an electrical signal, and a phosphor as a wavelength converting member for converting radiation into light, such as visible light, that can be photoelectrically converted by the photoelectric conversion element, is disposed thereon.

A first switching element 11 constituted of a first TFT is used for transferring an electrical signal, obtained by a photoelectric conversion from a light, such as a visible light, in the conversion element 1, while a second switching element 12 constituted of a second TFT is intended to apply a certain potential to the conversion element 1 after the signal transfer, thereby removing a charge remaining in the conversion element 1 after the signal transfer (such operation being hereinafter called a resetting).

The first switching element 11 is constituted, as shown in FIG. 12, of a first electrode 13 constituting a source electrode, a second electrode 14 constituting a drain electrode and a first gate electrode 15, among which the first electrode 13 is connected with the signal wiring 6 while the second electrode 14 is connected with the pixel electrode 9 of the conversion element 1. The second switching element 12 is constituted of a third electrode 16 constituting a source electrode, a fourth electrode 17 constituting a drain electrode and a second gate electrode 18, among which the third electrode 16 is connected with a reset wiring 19 while the fourth electrode 17 is connected with the pixel electrode 9 of the conversion element 1.

The conversion element 1 is formed in an area under from the pixel electrode 9 of the conversion element 1 to the bias wiring 8, and is disposed above the first switching element 11 and the second switching element 12. The pixel electrode 9 of the conversion element 1 is connected, via a through-hole 10, with the second electrode 14 of the first switching element 11 and with the fourth electrode 17 of the second switching element 12.

After radiation such as X-rays is converted into a light such as a visible light by the phosphor layer 44 and a charge corresponding to the irradiation amount of such light is accumulated in a pixel, the first gate driver circuit 61 applies a turn-on voltage for the first switching element 11 to the first gate electrode 15, thereby transferring information to the signal processing circuit 51 to form an image. Thereafter, a turn-off voltage for the first switching element 11 is applied to the first gate electrode 15, thereby terminating the transfer. Then the second gate driver circuit 62 applies a turn-on voltage for the second switching element 12 to the second gate electrode 18, and a reset potential for the conversion element 1 is applied from the reset wiring 19. After the lapse of a predetermined period, a turn-off voltage for the second switching element 12 is applied to the second gate electrode 18, thereby terminating the resetting.

Such separate drivings of the first switching element 11 and the second switching element 12 enable a signal transfer and a resetting at a high speed, thereby improving an image reading speed of the radiation detecting apparatus.

As shown in FIGS. 12 to 14, the conversion element 1 is disposed above the first switching element 11, the second switching element 12, the first gate wiring 20, the second gate wiring 21, the signal wiring 6 and the reset wiring 19, and the first gate wiring 20, the second gate wiring 21, the signal wiring 6 and the reset wiring 19 are so disposed as to pass through an area between the normal projection area of the pixel electrode 9 on the substrate and the lower electrode 9, in such a manner that both ends of each wiring, opposite to each other in a width direction, are present in such area. Therefore, even in the case of an alignment error in the exposure apparatus employed in the manufacturing process, each intersecting area remains constant, to stabilize the capacitances in various parts, thereby preventing image artifacts resulting from variations in the capacitances in various parts.

Also, in case of disposing plural switching elements within a pixel as shown in FIG. 12, a large aperture rate can be secured by disposing the conversion element above the switching elements and the wirings. Also, by disposing the switching element in the area between the normal projection area of the pixel electrode 9 on the substrate and the pixel electrode 9 as in the first embodiment, the overlapping area between the pixel electrode 9 of the conversion element 1 and the electrode of the TFT 2 remains constant, thereby stabilizing the capacitance.

As described above, all the wirings are so disposed as to pass through the area between the normal projection area of the pixel electrode 9 on the substrate and the pixel electrode 9, but it is also possible to dispose the signal wiring 6 only, or the first gate wiring 20 only, so as to pass through the area between the normal projection area of the pixel electrode 9 on the substrate and the pixel electrode 9. Also, either one of the wirings (first gate wiring 20 and signal wiring 6) of the first switching element 11 and the wirings (second gate wiring 21 and reset wiring 19) of the second switching element 12 may be so disposed as to pass through the area between the normal projection area of the pixel electrode 9 on the substrate and the pixel electrode 9. Furthermore, a part of the wirings (first gate wiring 20 and signal wiring 6) of the first switching element 11 and a part of the wirings (second gate wiring 21 and reset wiring 19) of the second switching element 12 may be so disposed as to pass through the area between the normal projection area of the pixel electrode 9 on the substrate and the pixel electrode 9.

Now, a layered structure of the pixel of the fifth embodiment will be explained with reference to FIG. 13 which is a cross-sectional view along a line 13-13 in FIG. 12 and FIG. 14, which is a cross-sectional view along a line 14-14 in FIG. 12.

The first switching element 11 includes a first electrode layer 31 constituting the gate electrode and the gate wiring, a first insulation layer 32 constituting a gate insulation film, a first semiconductor layer 33, a first impurity-doped semiconductor layer 34 constituting an ohmic contact layer, and a second electrode layer 35 constituting a source electrode, a drain electrode and a signal wiring.

The conversion element 1 is an MIS photoelectric converting element including a third electrode layer 37 (corresponding to the pixel electrode 9 in FIG. 12), a third insulation layer 38, a second semiconductor layer 39, a second impurity-doped semiconductor layer 40 functioning as an ohmic contact layer or a blocking layer, and a fifth electrode layer 42 (constituting an upper electrode), and is capable of a photoelectric conversion on a light such as a visible light. A fifth electrode layer 42 constituted of a transparent material such as ITO is disposed on the second impurity-doped semiconductor layer 40, but, in the case that the second impurity-doped semiconductor layer 40 has a low resistance, it may also serve as the electrode layer and the fifth electrode layer 42 may be dispensed with.

A fourth electrode layer 41 is a bias wiring for a voltage application to the fifth electrode layer 42, and is connected to a common electrode driver circuit 53 provided outside the substrate. The fourth electrode layer 41 is covered by the fifth electrode layer 42, but it is also possible to dispose the fifth electrode layer 42 under the fourth electrode layer 41. The third electrode layer 37 is connected to one of the electrodes (drain electrode) formed by the second electrode layer 35 constituting the switching element 2, via a through-hole formed in the second insulation layer 36. By turning on the switching element, a charge corresponding to the carriers generated in the second semiconductor layer 39 can be transferred to an external signal processing circuit (signal processing circuit 51 shown in FIG. 15).

As will be seen from FIGS. 12 to 14, the third electrode layer 37 (pixel electrode of the conversion element 1) is so disposed as to cover the second electrode layer 35 constituting the signal wiring 6 and the reset wiring 19, and the first electrode layer 31 constituting the first gate wiring 20 and the second gate wiring 21. Such arrangement provides a structure that, in the area between the normal projection area of the pixel electrode 9 on the substrate and the pixel electrode 9, the signal wiring 6, the reset wiring 19, the first gate wiring 20 and the second gate wiring 21 are so disposed as to pass through such area in such a manner that both ends of each wiring opposite to each other in a width direction are present in such area. Therefore, even in the case of an alignment error in the exposure apparatus employed in the manufacturing process, the overlapping area remains constant, to suppress a capacitance variation in the pixel electrode 9. Also, an organic insulation layer functioning as a planarization layer is employed as the second insulation layer 36 to be formed as the interlayer insulation layer between the switching element and the conversion element, thereby decreasing the capacity generated between the switching element and the conversion element. Also, the fifth electrode layer 42 (upper electrode of the conversion element 1) is preferably so disposed as to cover the second electrode layer 35, constituting the signal wiring 6 and the reset wiring 19, and the first electrode layer 31, constituting the first gate wiring 20 and the second gate wiring 21. In the present embodiment, both the third electrode layer 37 (pixel electrode of the conversion element 1) and the fifth electrode layer 42 (upper electrode of the conversion element 1) are so disposed as to cover the second electrode layer 35, constituting the signal wiring 6 and the reset wiring 19, and the first electrode layer 31, constituting the first gate wiring 20 and the second gate wiring 21.

An increase in a total capacity of the signal wiring 6, the first gate wiring and the second gate wiring leads to an increased noise in the image captured by the radiation detecting apparatus, or requires a larger time constant in a transfer operation of the TFT, whereby the image cannot be read at a high speed. It is therefore desirable to dispose, between the switching element 2 and the conversion element 1, an organic insulation layer that has a low dielectric constant and that can be formed in a thick film. The organic insulation layer is preferably formed with a material having a high heat resistance and a low dielectric constant, such as an acrylic resin or a polyimide, and is preferably formed with a thickness of 1 µm or larger in its thinnest part. The interlayer insulation layer need not be constituted of an organic insulation layer but may have a multi-layered structure constituted of an organic insulation layer and an inorganic insulation layer employed in FIG. 4.

Referring to a schematic equivalent circuit diagram of the radiation detecting apparatus of the present embodiment as shown in FIG. 15, a circuit including plural switching elements and a gate wiring within a pixel involves a complex arrangement of the wirings and the electrodes. When a wiring is disposed between the conversion elements or the conversion element is disposed so as to involve an overlapping in a part of the wirings, the capacitances in various parts are not stabilized by an alignment error in the exposure apparatus employed in the manufacturing process, thus resulting in artifacts in the image. Also, in such a case a stable manufacturing result is difficult to obtain because of the instability in the processed shapes. However, the characteristics and the manufacture can be stabilized by such a structure that the wirings are disposed, in an area below the pixel electrode, without protruding out from under the conversion element 1.

As shown in FIG. 16, the first gate driver circuit 61, the second gate driver circuit 62, the signal processing circuit 51 and the resetting circuit 63 are disposed in a peripheral portion of a panel, and a phosphor is disposed thereon, for converting radiation into light such as visible light. The common electrode driver circuit 53 shown in FIG. 15 is incorporated in the signal processing circuit 51.

FIGS. 12 to 16 show a system of employing, as the conversion element 1, a photoelectric conversion element for converting light such as visible light into an electrical signal and depositing a phosphor directly thereon. But it is also possible to form a phosphor on a substrate of a radiation-transmitting material such as carbon and to adhere the surface of such phosphor with an adhesive material to a substrate bearing photoelectric conversion elements. It is also possible to utilize, as the conversion element 1, a semiconductor element for converting radiation such as X-rays, a particulate beam of α-rays or β-rays, or γ-rays directly into an electrical signal, thereby dispensing with the phosphor. The semiconductor element capable of direct conversion of X-rays may include a semiconductor material such as amorphous selenium (a-Se).

In the first to fifth embodiments, the pixel electrode of the conversion element is formed in a rectangular shape, and the signal wiring, the reset wiring and/or the gate wiring (or first and second gate wirings) is so disposed as to cross two parallel sides, opposed to each other, of the pixel electrode. But the shape of the pixel electrode of the conversion element includes shapes considered to be substantially rectangular. For example, a pixel electrode of a shape partly removed is also included. Also the two sides, opposed to each other, of the pixel electrode include a state close to parallel within an extent capable of covering the fluctuation in the capacitance.

Sixth Embodiment

The present embodiment shows a constitution, in the pixel including two switching elements and a conversion element explained in the fifth embodiment, of further reducing the fluctuation in the capacitance.

Figure 17:
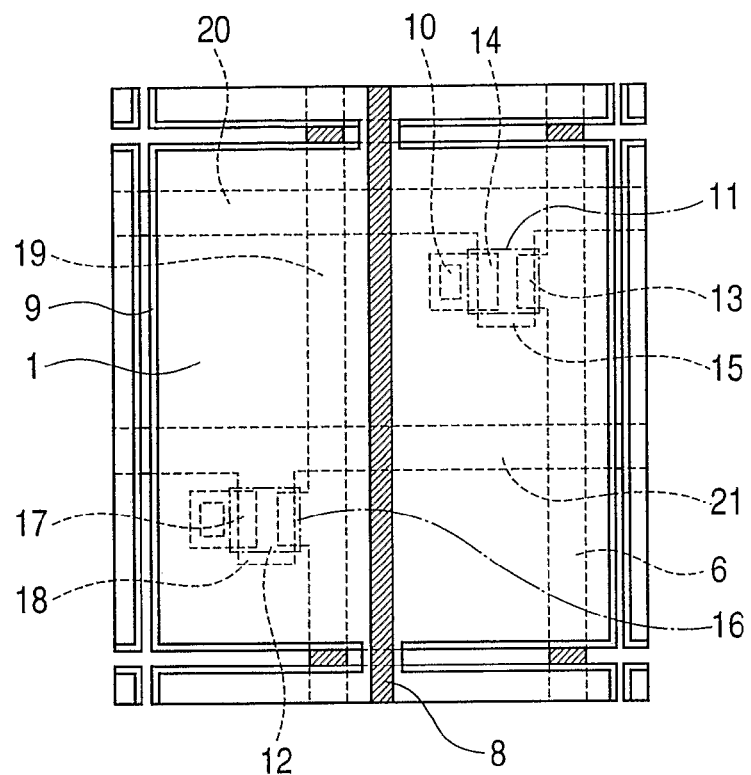
FIG. 17 is a plan view of a pixel in a sixth embodiment of the present invention.

A structure shown in FIG. 17 is different from that shown in FIG. 12, in that the first switching element 11 for transfer and the second switching element 12 for resetting are disposed in positions of parallel displacement with respect to each other.

More specifically, it is important that the first switching element 11 and the second switching element 12 has a same direction from an electrode, connected to the pixel electrode 9, to the other electrode, connected to the signal wiring 6 or the reset wiring 19.

It is also important that a direction from the first gate wiring 20 to an end of the first gate electrode is same as a direction from the second gate wiring 21 to an end of the second gate electrode.

It is further important that the fist switching element 11 and the second switching element 12 have an approximately same shape.

Now let us consider a case, in the structure shown in FIG. 12, of an error between a mask position for forming the first gate electrode 15 and the second gate electrode 21, and a mask position for forming the first electrode 13, the second electrode 14, the third electrode 16 and the fourth electrode 17. Such error results in variations in the following two characteristics, thus leading to image artifacts because of the capacitance fluctuation:

(1) Variation in Vth (Threshold Voltage)

An important parameter in a TFT is Vth (threshold voltage).

A voltage application higher than Vth turns on the TFT, thereby passing a current, and a voltage application lower than Vth turns off the TFT, thereby interrupting the current. This property is an important factor in a TFT matrix panel utilizing TFTs as the switching elements.

In case of a fluctuation in Vth among the pixels, even when a turning-off voltage is applied to the TFTs, the current may flow in certain pixels, thereby leading to an image failure.

As explained above, a change in the overlapping area between the source electrode or the drain electrode and the gate electrode of TFT causes Vth thereof to deviate from a design value.

For example, in case of a significant decrease in the overlapping area, Vth is shifted to a higher voltage. Therefore the TFT cannot be turned on unless a higher voltage is applied to the gate electrode, thereby resulting in a failure in the charge transfer.

As a result, an increase in Vth of either TFT in the pixel causes a decrease in Vth of the other TFT. It thus becomes impossible to control both TFTs, thereby inducing image artifacts resulting for example from a transfer failure.

(2) Potential of Pixel Electrode after Transfer and after Resetting

After a turn-on voltage for the first switching element 11 is applied to transfer the charge from the conversion element 1, a turn-off voltage for TFT is applied. Then, after a turn-on voltage for the second switching element 12 is applied to apply the resetting potential to the pixel electrode 9 of the conversion element 1, a turn-off voltage is applied.

Now let us consider a case, in the structure shown in FIG. 12, that a mask position for forming the first electrode 13, the second electrode 14, the third electrode 16 and the fourth electrode 17 is so displaced that an overlapping area decreases between the first gate electrode 15 of the first switching element 11 and the second electrode 14 connected with the pixel electrode 9. In such case an overlapping area increases between the second gate electrode 18 of the second switching element 12 and the fourth electrode 17 connected to the pixel electrode 9.

As a result, the first switching element 11 and the second switching element 12 have different capacitances. Also after the first switching element 11 or the second switching element 12 is turned on, the charge is distributed among the capacitances (charge sharing), but the potential of the pixel electrode 9 after the transfer is different from the potential of the pixel electrode 9 after the resetting. Such difference between the potential of the pixel electrode 9 after the transfer and the potential after the resetting results in, for example, in a radiation detecting apparatus, a misdetection of a charge corresponding to such potential difference.

Therefore, a mask alignment error in the formation of the switching element results in a potential fluctuation in the pixel electrode 9 within the pixel, and further results in a fluctuation in the pixel electrodes 9 within the TFT matrix panel.

Thus, in the radiation detecting apparatus, there result image artifacts in the captured image.

The constitution of the present embodiment is effective for reducing the artifacts resulting from a mask alignment error at the preparation of the switching element.

Seventh Embodiment

In the first to sixth embodiments, the pixel electrode of the conversion element has a rectangular shape, but the shape and the layout of the pixel electrode is not limited to such rectangular shape but may be selected arbitrarily.

Figure 18:
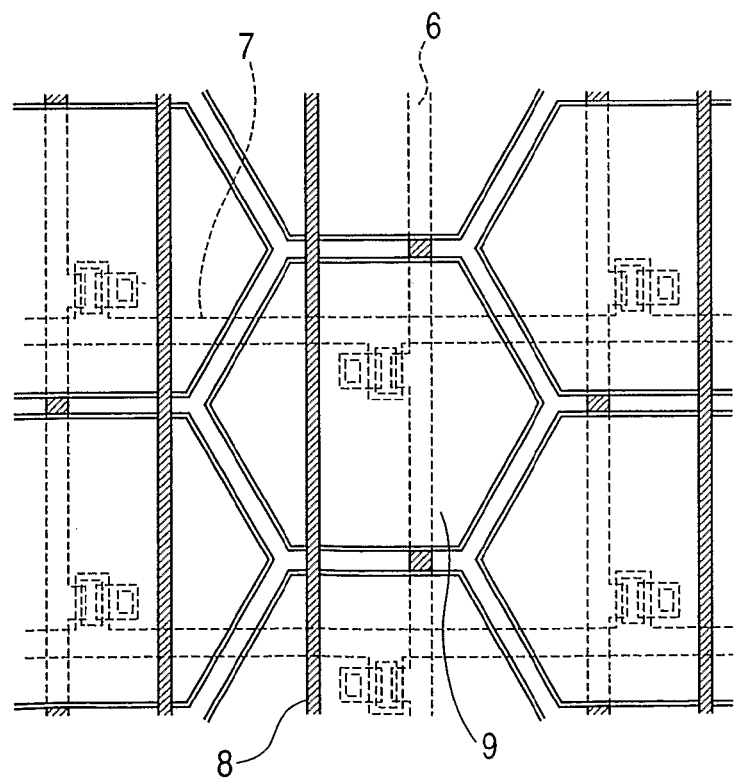
FIG. 18 is a plan view of a pixel in a seventh embodiment of the present invention.

In FIG. 18, the pixel electrodes 9 have a honeycomb structure, but the gate wiring 7 and the signal wiring 8 have a layout similar to that in the first and second embodiments. In the first to sixth embodiments, the pixel electrode of the conversion element has a rectangular shape, and the signal wiring 6 and/or the gate wiring 7 is so disposed as to cross parallel two sides, opposite to each other, of the pixel electrode.

In the present embodiment, the gate wiring 7 passes two non-parallel sides, namely the obliquely patterned two sides of the pixel electrode 9, so as to pass through the area between the normal projection area of the pixel electrode 9 on the substrate and the pixel electrode 9.

An alignment error between the gate wiring 7 and the pixel electrode 9 causes a certain change in the capacitance between the gate wiring and the pixel electrode in each pixel, and, in the prior structure, such capacitance change is large because the overlapping area is changed by a displacement of the gate wiring or the signal wiring in a width direction thereof. However, in the gate wiring shown in FIG. 18, the overlapping area is changed by a displacement approximately in the longitudinal direction, so that the capacitance change is limited, whereby, in comparison with the prior structure, the capacitance can be stabilized with limited fluctuation to provide a captured image or a displayed image with suppressed artifacts.

Also, as it is not necessary to execute the pixel isolation of the lower electrode on and along the gate wiring, the process can be executed without the influence of the step difference whereby the conversion element can be formed in stable manner.

In FIG. 18, the signal wiring 6 crosses two sides perpendicular to the signal wiring in the hexagonal pixel electrode 9, and is so disposed as to pass through an area between the normal projection area of the pixel electrode 9 on the substrate and the pixel electrode 9, in such a manner that both ends of the signal wiring 6, opposite to each other in a width direction, are present in such area. However, it is also possible to dispose the signal wiring 6 so as to cross the obliquely patterned two sides of the pixel electrode 9 and to dispose the gate wiring so as to cross two sides, perpendicular to the signal wiring in the hexagonal pixel electrode. Also, both wirings (gate wiring and signal wiring) may be respectively so disposed as to cross the obliquely patterned two sides.

In the foregoing embodiments, in case of forming the third electrode layer 37 constituting the pixel electrode 9 of the conversion element or the fifth electrode layer 42 constituting the upper electrode so as to cover the signal wiring 6 or the gate wiring 7, such wiring is preferably positioned inside, by 1 to 3 μm or more, from the end of the pixel electrode. This is because the alignment error between the layers in the process of forming conversion element may reach such area, as the specifications of an ordinary exposure apparatus involve an alignment error of about 1 μm in a use under a highly precise strict control or about 3 μm under an ordinary control. Also an error of about 1.5 times of the above-mentioned value depending on the structure of an alignment tree, it is preferable, if possible, an inside positioning of about 10 μm. Also in case plural wirings are provided in the row direction or in the column direction with a pixel, it is more preferable that the wirings have an approximately same distance.

Eighth Embodiment

In the following, a radiation detection system, utilizing the radiation detecting apparatus of the present invention, will be explained with reference to FIG. 19.

Figure 19:
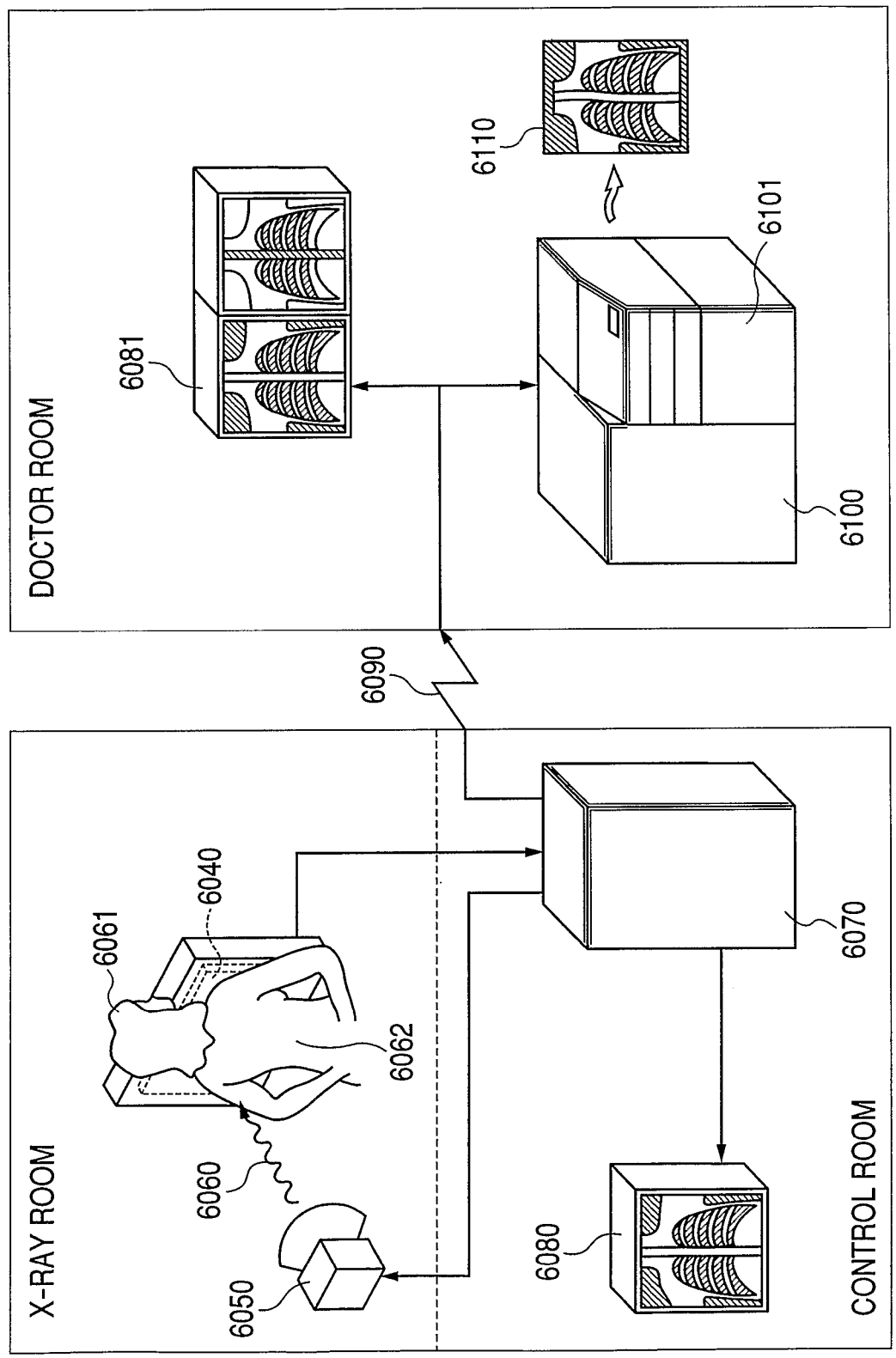
FIG. 19 is a view showing a radiation detecting system employing a radiation detecting apparatus of the present invention.
Figure 20:
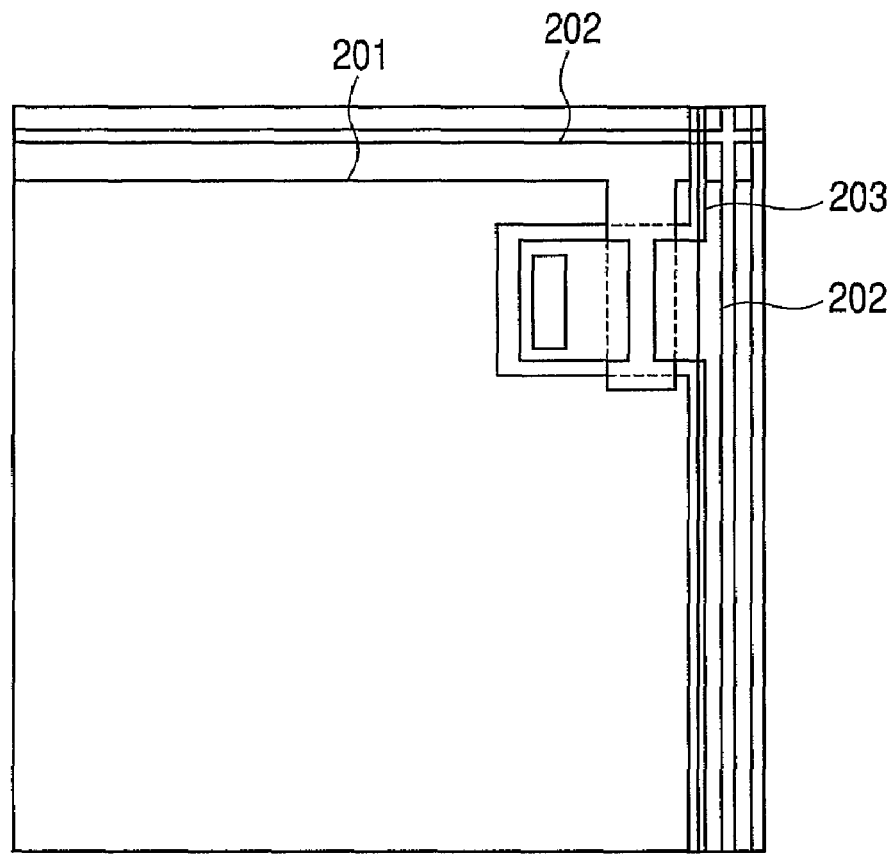
FIG. 20 is a plan view showing an example of a pixel in a prior radiation detecting apparatus.

As shown in FIG. 19, an X-ray beam 6060 generated by an X-ray tube 6050 passes through the chest 6062 of a person 6061 who is being examined, and enters a radiation detecting apparatus 6040. The incident X-ray beam contains information on the interior of body of the examined person 6061. In response to the incident X-ray beam, the phosphor of the radiation detecting apparatus 6040 emits light, which is subjected to a photoelectric conversion to obtain electrical information. The information is converted into a digital signal which is subjected to an image processing by an image processor 6070 constituting signal processing means, and can be observed on a display 6080 constituting display means in a control room.

Also, this information can be transferred, by transmission means such as a telephone channel 6090, to a remote location and displayed on a display 6081 in a doctor's office or recorded in a recording medium such as an optical disk by recording means such as an optical disk apparatus, for diagnosis by a doctor in a remote location. The information may also be recorded on a film 6110 by a laser printer 6101 of a film processor 6100.

As many apparently widely different embodiments of the present invention can be made without departing from the spirit and scope thereof, it is to be understood that the invention is not limited to the specific embodiments thereof except as defined in the claims.

INDUSTRIAL APPLICABILITY

The present invention is applicable to a radiation detecting apparatus, utilizing a switching element and a conversion element, for medical purpose and for non-destructive inspection. It is also applicable to a detecting apparatus for converting a light such as a visible light into an electrical signal, particularly to a detecting apparatus having a large-area photoelectric conversion area.

This application claims priorities from Japanese Patent Application No. 2005-214227, filed on Jul. 25, 2005, and No. 2006-195146, filed on Jul. 18, 2006, which are hereby incorporated by reference herein.

The invention claimed is:

1. A radiation detecting apparatus comprising:

a plurality of pixels each provided with a plurality of switching elements disposed over an insulating substrate and a conversion element disposed on said switching element, wherein the plurality of said switching elements of each pixel are connected to said electrode of said conversion element of each pixel, wherein said plurality of said switching elements of each pixel include a switching element for transfer and a switching element for resetting, and wherein said switching element for resetting is connected to a reset wiring;

a plurality of signal wirings arranged along one direction and connected with said switching elements for transfer of said plurality of pixels; and a plurality of first control wirings arranged in a direction different from said one direction and connected with control terminals of said switching elements for transfer of said plurality of pixels, wherein said conversion elements have electrodes separated respectively per each of said pixels, wherein both ends of said signal wiring, opposed to each other in a width direction, and both ends of said first control wiring, opposed to each other in a width direction are disposed within an area of said electrode seen from the above of said conversion element, and wherein the plurality of said switching elements of each pixel have the same direction from a first terminal connected to the electrode of said conversion element of the each pixel to a second terminal connected to said signal wiring or the reset wiring, and said control terminals of the switching elements of each pixel have the same directional disposition.

2. A radiation detecting apparatus according to claim 1, wherein said switching element is disposed within said area.

3. A radiation detecting apparatus according to claim 1, wherein an intersection of said signal wiring and said control wiring is disposed within said area.

4. A radiation detecting apparatus according to claim 1, wherein both ends of said signal wiring and said control wiring in a width direction are disposed more than 1 μm inside of an end of said electrode.

5. A radiation detecting apparatus according to claim 1, further comprising an insulation layer between said switching element and said conversion element.

6. A radiation detecting apparatus according to claim 5, wherein said insulation layer is formed by an organic resin.

7. A radiation detecting apparatus according to claim 1, wherein said conversion element is formed by a PIN photoelectric conversion element or an MIS photoelectric conversion element.

8. A radiation detecting apparatus according to claim 1, further comprising a wavelength converting member on said conversion element.

9. A radiation detecting apparatus according to claim 1, wherein said conversion element is capable of converting a radiation directly into an electric charge.

10. A radiation detecting system comprising:

a radiation detecting apparatus according to claim 1;

signal processing means which processes a signal from said radiation detecting apparatus;

recording means which records a signal from said signal processing means;

display means which displays a signal from said signal processing means;

transmission process means which transmits a signal from said signal processing means; and a radiation source for generating radiation.

11. A radiation detecting apparatus according to claim 1, further comprising a plurality of second control wirings arranged in a direction different from said one direction and connected with control terminals of said plural switching elements for resetting, and both ends of said second control wiring, opposed to each other in a width direction are disposed within an area of said electrode seen from above said conversion element.

12. A radiation detecting apparatus according to claim 1, wherein said reset wiring arranged along one direction, and both ends of said reset wiring, opposed to each other in a width direction are disposed within said area of said electrode seen from above said conversion element.

* * * * *